US011380584B2

(12) United States Patent
Shigetoshi

(10) Patent No.: US 11,380,584 B2
(45) Date of Patent: Jul. 5, 2022

(54) SEMICONDUCTOR DEVICE AND MANUFACTURING METHOD OF SEMICONDUCTOR DEVICE INCLUDING A THROUGH ELECTRODE FOR CONNECTION OF WIRINGS

(71) Applicant: SONY SEMICONDUCTOR SOLUTIONS CORPORATION, Kanagawa (JP)

(72) Inventor: Takushi Shigetoshi, Nagasaki (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 16/969,665

(22) PCT Filed: Dec. 28, 2018

(86) PCT No.: PCT/JP2018/048399
§ 371 (c)(1),
(2) Date: Aug. 13, 2020

(87) PCT Pub. No.: WO2019/163293
PCT Pub. Date: Aug. 29, 2019

(65) Prior Publication Data
US 2020/0402854 A1 Dec. 24, 2020

(30) Foreign Application Priority Data

Feb. 23, 2018 (JP) .............................. JP2018-030632

(51) Int. Cl.
*H01L 21/768* (2006.01)
*H01L 21/762* (2006.01)
(Continued)

(52) U.S. Cl.
CPC .............. *H01L 21/76898* (2013.01); *H01L 21/76232* (2013.01); *H01L 23/481* (2013.01);
(Continued)

(58) Field of Classification Search
CPC combination set(s) only.
See application file for complete search history.

(56) References Cited

U.S. PATENT DOCUMENTS 9,941,165 B2 * 4/2018 Migita ...................... B08B 3/02
10,070,525 B2 * 9/2018 Rodriguez .......... H01L 23/5386
(Continued)

FOREIGN PATENT DOCUMENTS

| CN | 1671273 A | 9/2005 |
| CN | 1677658 A | 10/2005 |

(Continued)

OTHER PUBLICATIONS

International Search Report and Written Opinion of PCT Application No. PCT/JP2018/048399, dated Feb. 12, 2019, 10 pages of ISRWO.

*Primary Examiner* — Mamadou L Diallo
(74) *Attorney, Agent, or Firm* — Chip Law Group

(57) ABSTRACT

Damage to a semiconductor device at the time of forming a via hole in which a through electrode is arranged is prevented. The semiconductor device includes a cylindrical insulating film, a front surface side pad, a conductor layer, and a back surface side pad. The cylindrical insulating film is configured in a cylindrical shape penetrating a semiconductor substrate. The front surface side pad is formed adjacent to a front surface of the semiconductor substrate inside the cylindrical insulating film. The conductor layer is arranged adjacent to the front surface side pad and an inner side of the cylindrical insulating film after removing the semiconductor substrate inside the cylindrical insulating
(Continued)

film adjacent to the front surface side pad. The back surface side pad is arranged on a back surface of the semiconductor substrate and is connected to the front surface side pad via the conductor layer.

11 Claims, 13 Drawing Sheets

(51) Int. Cl.
    *H01L 23/48* (2006.01)
    *H01L 23/00* (2006.01)
    *H01L 27/146* (2006.01)
    *H01L 21/306* (2006.01)
    *H01L 21/3065* (2006.01)

(52) U.S. Cl.
    CPC ........ *H01L 24/05* (2013.01); *H01L 27/14636* (2013.01); *H01L 21/3065* (2013.01); *H01L 21/30604* (2013.01); *H01L 2224/0557* (2013.01)

(56) References Cited

U.S. PATENT DOCUMENTS

| | | | |
|---|---|---|---|
| 2005/0205997 A1 | 9/2005 | Yamamoto et al. | |
| 2005/0221601 A1 | 10/2005 | Kawano | |
| 2008/0157361 A1* | 7/2008 | Wood | B81B 7/0006 257/738 |
| 2008/0237781 A1 | 10/2008 | Uchiyama | |
| 2009/0189256 A1 | 7/2009 | Yoshimura et al. | |
| 2010/0218977 A1* | 9/2010 | Inoue | B32B 37/12 174/250 |
| 2010/0276786 A1* | 11/2010 | Cotte | H01L 21/76898 257/621 |
| 2011/0248405 A1 | 10/2011 | Li et al. | |
| 2014/0346668 A1* | 11/2014 | Mitsuhashi | H01L 23/49827 257/737 |
| 2015/0214134 A1* | 7/2015 | Ogiso | H01L 23/481 257/753 |
| 2016/0111372 A1* | 4/2016 | Lu | H01L 21/76831 257/774 |
| 2016/0155744 A1* | 6/2016 | Rhie | H01L 28/91 257/296 |
| 2016/0167958 A1* | 6/2016 | Shkel | H01L 21/76877 257/774 |
| 2017/0077053 A1* | 3/2017 | Keser | H01L 21/565 |
| 2019/0273090 A1* | 9/2019 | Fukuzumi | H01L 27/11575 |

FOREIGN PATENT DOCUMENTS

| | | |
|---|---|---|
| CN | 102301465 A | 12/2011 |
| CN | 102884870 A | 1/2013 |
| EP | 1577942 A2 | 9/2005 |
| JP | 2002-289623 A | 10/2002 |
| JP | 2003-309221 A | 10/2003 |
| JP | 2005-294577 A | 10/2005 |
| JP | 2005-303258 A | 10/2005 |
| JP | 2008-251964 A | 10/2008 |
| JP | 2009-181981 A | 8/2009 |
| JP | 2012-525696 A | 10/2012 |
| JP | 2012-248721 A | 12/2012 |
| JP | 2015-073134 A | 4/2015 |
| KR | 10-2013-0014568 A | 2/2013 |
| TW | 200535977 A | 11/2005 |
| WO | 2010/125164 A1 | 11/2010 |
| WO | 2011/127041 A1 | 10/2011 |
| WO | 2017/038108 A1 | 3/2017 |

\* cited by examiner

SEMICONDUCTOR DEVICE AND MANUFACTURING METHOD OF SEMICONDUCTOR DEVICE INCLUDING A THROUGH ELECTRODE FOR CONNECTION OF WIRINGS

CROSS REFERENCE TO RELATED APPLICATIONS

This application is a U.S. National Phase of International Patent Application No. PCT/JP2018/048399 filed on Dec. 28, 2018, which claims priority benefit of Japanese Patent Application No. JP 2018-030632 filed in the Japan Patent Office on Feb. 23, 2018. Each of the above-referenced applications is hereby incorporated herein by reference in its entirety.

TECHNICAL FIELD

The present disclosure relates to a semiconductor device and a manufacturing method of a semiconductor device. More specifically, the present disclosure relates to a semiconductor device including a through electrode and a manufacturing method of a semiconductor device.

BACKGROUND ART

Conventionally, a semiconductor device in which wirings are formed on a front surface and a back surface of a semiconductor substrate has been used. For example, in a semiconductor device in which a back surface side of a semiconductor substrate (semiconductor chip) and an interposer are mounted by soldering, a diffusion layer and a wiring region are formed on a front surface of the semiconductor substrate, and a pad for solder mounting and a wiring layer connected to the pad are formed on a back surface of the semiconductor substrate. Such wirings arranged on the front surface and the back surface of the semiconductor substrate can be connected to each other by a through electrode arranged in a via hole penetrating the semiconductor substrate.

As a method of forming this via hole, a via-first method of forming a via hole before forming a diffusion layer of a semiconductor substrate, a via-middle method of forming a via hole after forming a diffusion layer and before forming a wiring region, and a via-last method of forming a via hole after forming a wiring region have been proposed. In the via-first method and the via-middle method, it is necessary to form a relatively large via hole and a fine diffusion layer or wiring at the same time, and thus, there is a problem that a manufacturing process is complicated and a manufacturing cost is increased. On the other hand, in the via-last method, the via hole is formed in the semiconductor substrate in which the diffusion layer and the wiring region are formed, and a process of forming the diffusion layer and the wiring region of the semiconductor substrate and a process of forming the via hole can thus be separated from each other, such that it becomes possible to reduce a manufacturing cost. As a semiconductor device that has adopted this via-last method, a semiconductor device in which a via hole is formed by forming an insulating film having an annular cross section at a predetermined depth from a front surface side of a semiconductor substrate and then removing the semiconductor substrate inside an annular groove portion from a back surface side of the semiconductor substrate has been used (see, for example, Patent Document 1).

In this semiconductor device, an annular insulating film is formed by forming a groove portion having an annular cross section in the semiconductor substrate and then performing thermal oxidation to arrange an insulating film on a front surface of the semiconductor substrate including the groove portion. Thereafter, the semiconductor substrate is ground from the back surface side to expose an end portion on a back surface side of the annular insulating film, and the semiconductor substrate inside the annular groove portion is removed by etching. A through electrode is formed by filling the via hole formed as described above with a conductor. An annular insulating material used for forming the via hole is continuously used as an insulating film for insulating a conductor of the via hole and the semiconductor substrate from each other.

In the semiconductor device described above, a wiring connected to the through electrode is formed on the annular insulating film. Therefore, the insulating film formed on the front surface of the semiconductor substrate when the annular insulating film is formed exists between the wiring and the semiconductor substrate. At the time of forming the via hole, it is necessary to remove the insulating film existing between this semiconductor substrate and the wiring, and the insulating film is etched and removed together with the semiconductor substrate inside the annular groove portion. This etching is performed by anisotropic dry etching. Note that in dry etching, etching of a semiconductor or an insulating film is performed by a plasma-like etching gas.

CITATION LIST

Patent Document

Patent Document 1: Japanese Patent Application Laid-Open No. 2012-248721

SUMMARY OF THE INVENTION

Problems to be Solved by the Invention

The conventional technology described above has a problem that a semiconductor element arranged on the semiconductor substrate is damaged because the via hole is formed by the dry etching. In the dry etching, an etching gas ionized by plasma discharge is injected into the semiconductor substrate. Therefore, the wiring or the like of the semiconductor substrate is charged to cause dielectric breakdown of the semiconductor element, such that the semiconductor device is deteriorated. By arranging a protection diode or the like, it is possible to prevent the deterioration of the semiconductor device due to the charging. However, when the protection diode is arranged, a problem that a configuration of the semiconductor device becomes complicated occurs. As such, in the semiconductor device that adopts the via-last method as the method of forming a via hole, there is a problem that the semiconductor device is deteriorated when the via hole is formed.

The present disclosure has been made in view of the problem described above, and an object of the present disclosure is to prevent damage to a semiconductor device at the time of forming a via hole in which a through electrode is arranged.

Solutions to Problems

The present disclosure has been made to solve the problem described above, and a first aspect of the present disclosure is a semiconductor device including: a cylindrical insulating film that is configured in a cylindrical shape penetrating a semiconductor substrate; a front surface side pad that is formed adjacent to a front surface of the semiconductor substrate inside the cylindrical insulating film; a conductor layer that is arranged adjacent to the front surface side pad and an inner side of the cylindrical insulating film after removing the semiconductor substrate inside the cylindrical insulating film adjacent to the front surface side pad; and a back surface side pad that is arranged on a back surface of the semiconductor substrate and is connected to the front surface side pad via the conductor layer.

Furthermore, in the first aspect, the conductor layer may be arranged after the semiconductor substrate inside the cylindrical insulating film adjacent to the front surface side pad is removed by a method different from plasma etching.

Furthermore, in the first aspect, the conductor layer may be arranged after the semiconductor substrate inside the cylindrical insulating film adjacent to the front surface side pad is removed by wet etching.

Furthermore, in the first aspect, the conductor layer may be arranged after the semiconductor substrate inside the cylindrical insulating film adjacent to the front surface side pad is removed by chemical dry etching.

Furthermore, in the first aspect, the semiconductor device may further include an insulating layer that is arranged on the front surface of the semiconductor substrate and covers the front surface side pad.

Furthermore, a second aspect of the present disclosure is a manufacturing method of a semiconductor device including: a semiconductor substrate removing step of removing a semiconductor substrate adjacent to a front surface side pad and an inner side of a cylindrical insulating film, the front surface side pad being formed adjacent to a front surface of the semiconductor substrate inside the cylindrical insulating film configured in a cylindrical shape penetrating the semiconductor substrate; a conductor layer arranging step of arranging a conductor layer adjacent to an inner side of the cylindrical insulating film in which the semiconductor substrate has been removed and the front surface side pad; and a back surface side pad arranging step of arranging a back surface side pad on a back surface of the semiconductor substrate, the back surface side pad being connected to the front surface side pad via the conductor layer.

Furthermore, in the second aspect, in the semiconductor substrate removing step, the semiconductor substrate inside the cylindrical insulating film adjacent to the front surface side pad may be removed by a method different from plasma etching.

Furthermore, in the second aspect, in the semiconductor substrate removing step, the semiconductor substrate inside the cylindrical insulating film adjacent to the front surface side pad may be removed by wet etching.

Furthermore, in the second aspect, in the semiconductor substrate removing step, the semiconductor substrate inside the cylindrical insulating film adjacent to the front surface side pad may be removed by chemical dry etching.

Furthermore, in the second aspect, the manufacturing method of a semiconductor device may further include an insulating layer arranging step of arranging an insulating layer on the front surface of the semiconductor substrate, the insulating layer covering the formed front surface side pad, in which in the semiconductor substrate removing step, the semiconductor substrate may be removed after the insulating layer is arranged.

Furthermore, in the second aspect, the manufacturing method of a semiconductor device may further include: a cylindrical insulating film arranging step of arranging the cylindrical insulating film in the semiconductor substrate; and a front surface side pad forming step of forming the front surface side pad adjacent to the front surface of the semiconductor substrate inside the arranged cylindrical insulating film, in which in the semiconductor substrate removing step, the semiconductor substrate adjacent to the front surface side pad formed adjacent to the front surface of the semiconductor substrate inside the arranged cylindrical insulating film and the inner side of the cylindrical insulating film may be removed.

Furthermore, in the second aspect, the manufacturing method of a semiconductor device may further include: a front surface side pad forming step of forming the front surface side pad adjacent to the front surface of the semiconductor substrate; and a cylindrical insulating film arranging step of arranging the cylindrical insulating film that is an insulating film configured in a cylindrical shape surrounding the formed front surface side pad and penetrating the semiconductor substrate, in which in the semiconductor substrate removing step, the semiconductor substrate adjacent to the front surface side pad formed adjacent to the front surface of the semiconductor substrate inside the arranged cylindrical insulating film and the inner side of the cylindrical insulating film may be removed.

According to the aspect described above, the front surface side pad is formed adjacent to the front surface of the semiconductor substrate, such that the semiconductor substrate adjacent to the front surface side pad is removed at the time of forming a via hole. Since an insulating material is not interposed between the semiconductor substrate and the front surface side pad, a step of removing the insulating material at the time of forming the via hole can be omitted, such that prevention of deterioration of the semiconductor device due to the step is assumed.

Effects of the Invention

According to the present disclosure, there is an excellent effect of preventing damage to a semiconductor device at the time of forming a via hole in which a through electrode is arranged.

MODE FOR CARRYING OUT THE INVENTION

Figure 1:
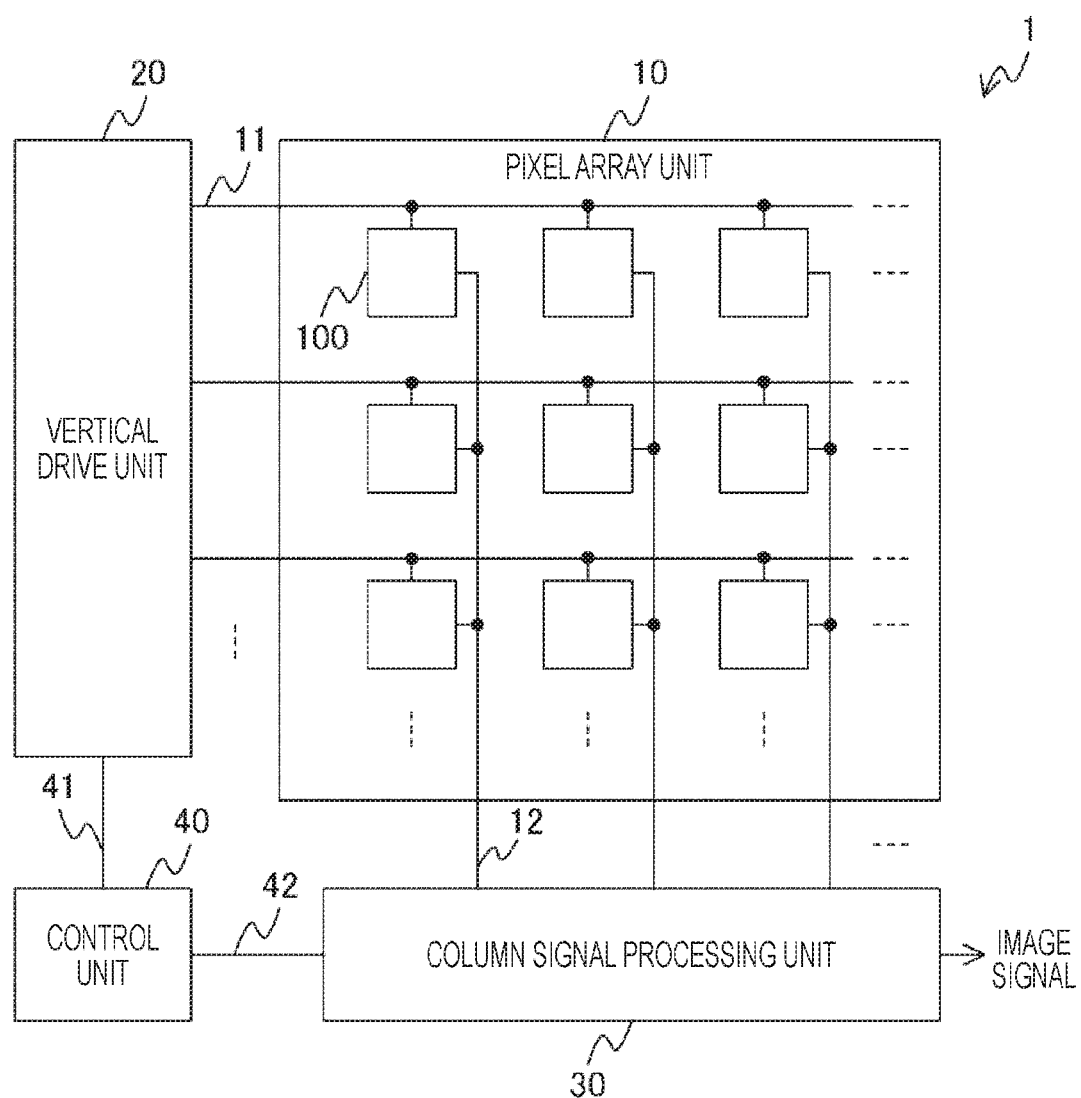
FIG. 1 is a diagram illustrating a configuration example of an imaging element according to an embodiment of the present disclosure.

Next, a mode (hereinafter referred to as an "embodiment") for carrying out the present disclosure will be described with reference to the drawings. In the following drawings, the same or similar parts are denoted by the same or similar reference numerals. However, the drawings are schematic, and dimensional ratios and the like of respective parts do not necessarily coincide with actual ratios and the like. Furthermore, it is needless to say that parts having different dimensional relationships or ratios between the drawings are included. Furthermore, embodiments will be described in the following order.
1. First Embodiment
2. Second Embodiment
3. Third Embodiment
4. Fourth Embodiment
5. Fifth Embodiment
6. Application example to camera

1. FIRST EMBODIMENT

[Configuration of Imaging Element]
FIG. 1 is a diagram illustrating a configuration example of an imaging element according to an embodiment of the present disclosure. FIG. 1 is a diagram illustrating a configuration of an imaging element 1 constituted by a semiconductor chip. A semiconductor device according to the present disclosure will be described by taking the imaging element 1 of FIG. 1 as an example. The imaging element 1 of FIG. 1 includes a pixel array unit 10, a vertical drive unit 20, a column signal processing unit 30, and a control unit 40.

The pixel array unit 10 is configured by arranging pixels 100 in a two-dimensional lattice shape. Here, the pixel 100 generates an image signal corresponding to irradiated light. The pixel 100 includes a photoelectric conversion unit that generates an electric charge corresponding to the irradiated light. Furthermore, the pixel 100 further includes a pixel circuit. The pixel circuit generates an image signal based on the electric charge generated by the photoelectric conversion unit. The generation of the image signal is controlled by a control signal generated by a vertical drive unit 20 as described later. Signal lines 11 and 12 are arranged in an XY matrix shape in the pixel array unit 10. The signal line 11 is a signal line transmitting a control signal of the pixel circuit in the pixel 100, is arranged for every row of the pixel array unit 10, and is commonly wired to the pixels 100 arranged in each row. The signal line 12 is a signal line transmitting a pixel signal generated by the pixel circuit of the pixel 100, is arranged for every column of the pixel array unit 10, and is commonly wired to the pixels 100 arranged in each column. These photoelectric conversion units and pixel circuits are formed on a semiconductor substrate.

The vertical drive unit 20 generates a control signal for the pixel circuit of the pixel 100. The vertical drive unit 20 transmits the generated control signal to the pixel 100 via the signal line 11 of FIG. 1. The column signal processing unit 30 processes an image signal generated by the pixel 100. The column signal processing unit 30 processes the image signal transmitted from the pixel 100 via the signal line 12 of FIG. 1. For example, analog-to-digital conversion for converting an analog image signal generated in the pixel 100 into a digital image signal corresponds to the processing in the column signal processing unit 30. The image signal processed by the column signal processing unit 30 is output as an image signal of the imaging element 1. The control unit 40 controls the entire imaging element 1. The control unit 40 controls the imaging element 1 by generating and outputting control signals for controlling the vertical drive unit 20 and the column signal processing unit 30. The control signals generated by the control unit 40 are transmitted to the vertical drive unit 20 and the column signal processing unit 30 through signal lines 41 and 42, respectively.

Figure 2:
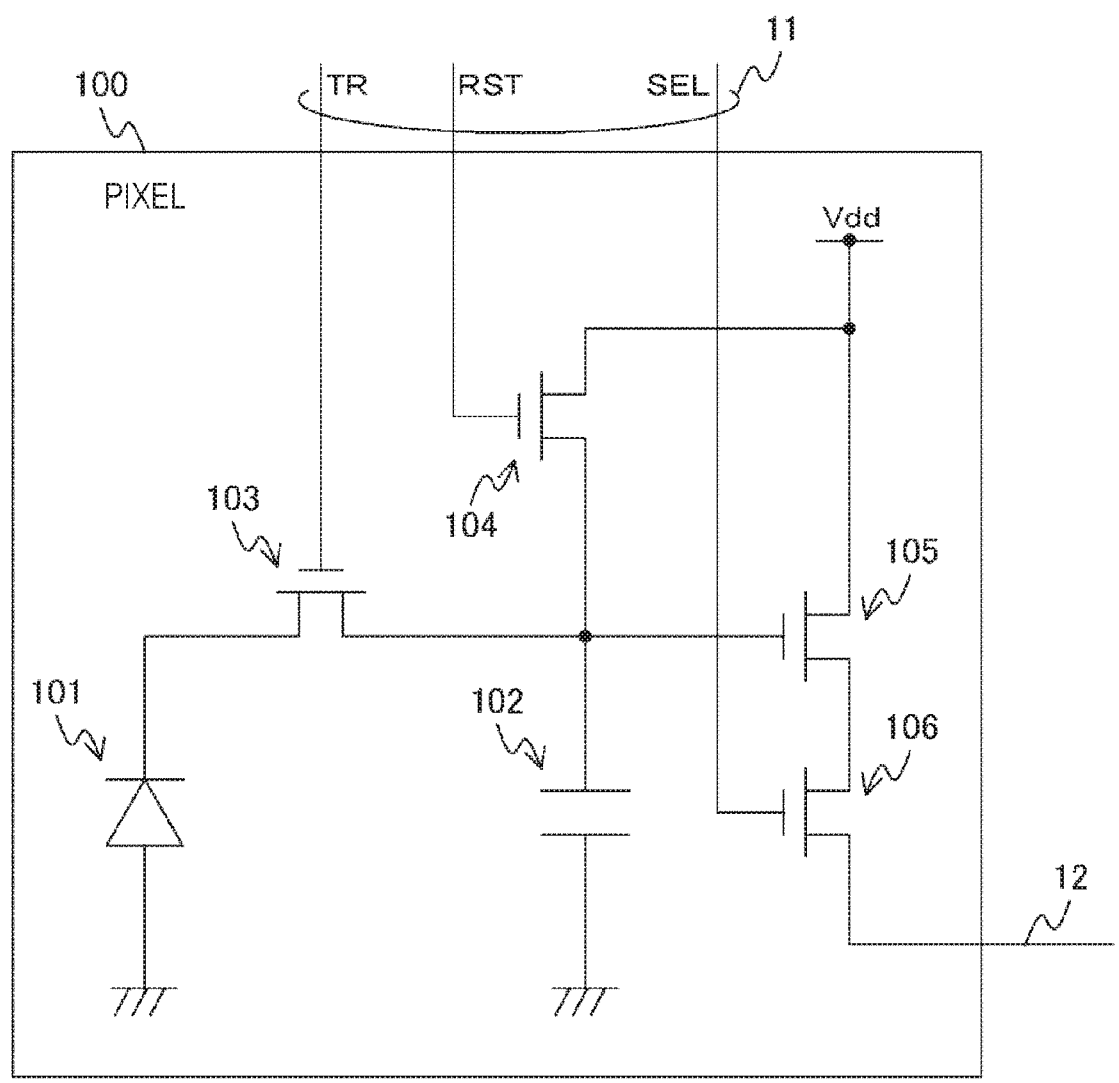
FIG. 2 is a diagram illustrating a configuration example of a pixel circuit according to the embodiment of the present disclosure.

[Configuration of Pixel Circuit]
FIG. 2 is a diagram illustrating a configuration example of the pixel circuit according to an embodiment of the present disclosure. FIG. 2 is a circuit diagram illustrating a configuration example of the pixel 100. The pixel 100 of FIG. 2 includes a photoelectric conversion unit 101, an electric charge holding unit 102, and metal oxide semiconductor (MOS) transistors 103 to 106.

An anode of the photoelectric conversion unit 101 is grounded, and a cathode of the photoelectric conversion unit 101 is connected to a source of the MOS transistor 103. A drain of the MOS transistor 103 is connected to a source of the MOS transistor 104, a gate of the MOS transistor 105, and one end of the electric charge holding unit 102. The other end of the electric charge holding unit 102 is grounded. Drains of the MOS transistors 105 and 106 are commonly connected to a power supply line Vdd, and a source of the MOS transistor 105 is connected to the drain of the MOS transistor 106. A source of the MOS transistor 106 is connected to the signal line 12. Gates of the MOS transistors 103, 104, and 106 are connected to a transfer signal line TR, a reset signal line RST, and a selection signal line SEL, respectively. Note that the transfer signal line TR, the reset signal line RST, and the selection signal line SEL constitute the signal line 11.

The photoelectric conversion unit 101 generates the electric charges corresponding to the irradiated light as described above. A photodiode can be used for the photoelectric conversion unit 101. Furthermore, the electric charge holding unit 102 and the MOS transistors 103 to 106 constitute the pixel circuit.

The MOS transistor 103 is a transistor that transfers electric charges generated by photoelectric conversion of the photoelectric conversion unit 101 to the electric charge holding unit 102. The transfer of the electric charges in the MOS transistor 103 is controlled by a signal transmitted through the transfer signal line TR. The electric charge holding unit 102 is a capacitor that holds the electric charges transferred by the MOS transistor 103. The MOS transistor 105 is a transistor that generates a signal based on the electric charges held in the electric charge holding unit 102.

The MOS transistor 106 is a transistor that outputs the signal generated by the MOS transistor 105 to the signal line 12 as an image signal. The MOS transistor 106 is controlled by a signal transmitted by the selection signal line SEL.

The MOS transistor 104 is a transistor that resets the electric charge holding unit 102 by discharging the electric charge held in the electric charge holding unit 102 to the power supply line Vdd. The reset by the MOS transistor 104 is controlled by a signal transmitted through the reset signal line RST, and is executed before the transfer of the electric charges by the MOS transistor 103. Note that at the time of this reset, the photoelectric conversion unit 101 can also be reset by turning on the MOS transistor 103. As such, the pixel circuit converts the electric charges generated by the photoelectric conversion unit 101 into the image signal.

[Cross-Sectional Configuration of Imaging Element]

Figure 3:
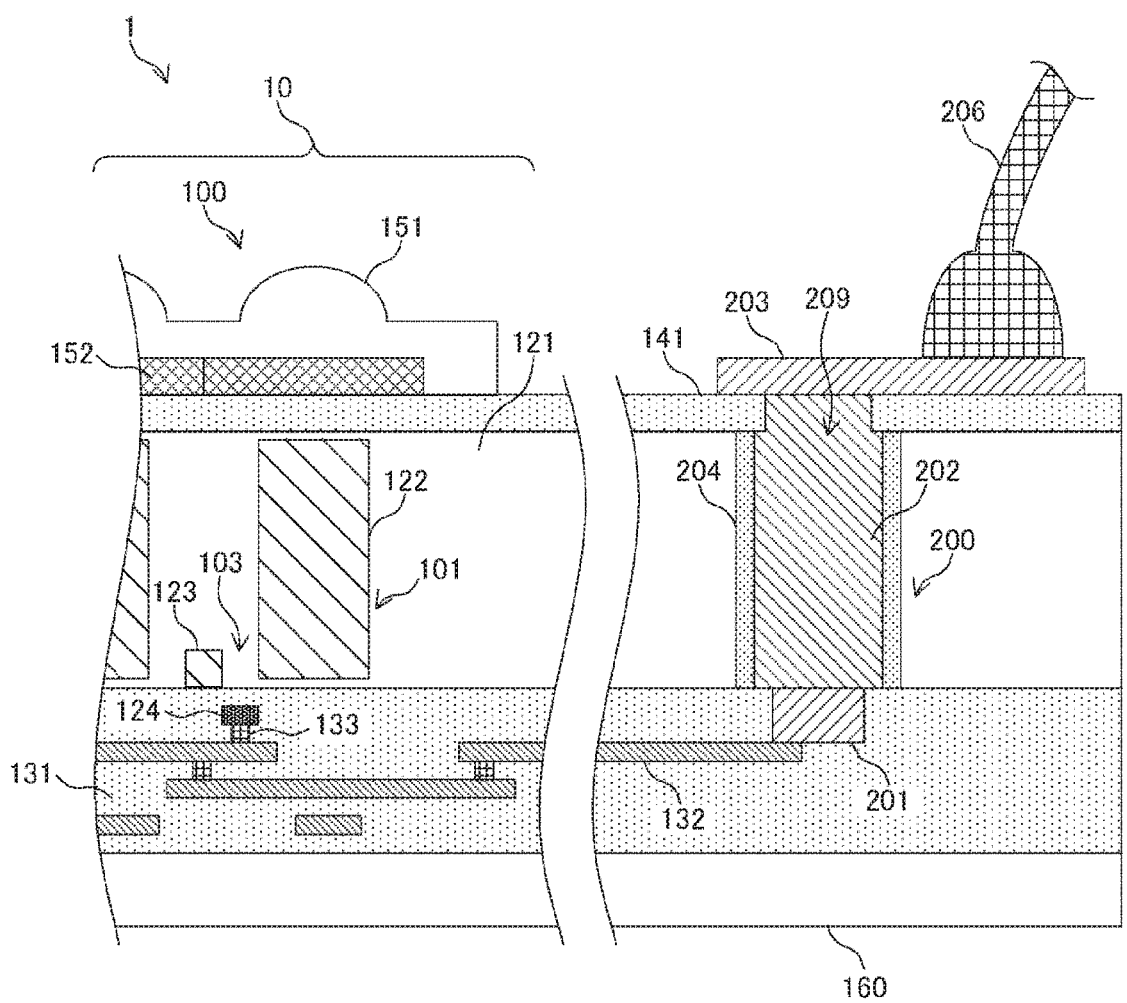
FIG. 3 is a cross-sectional view illustrating a configuration example of an imaging element according to a first embodiment of the present disclosure.

FIG. 3 is a cross-sectional view illustrating a configuration example of an imaging element according to a first embodiment of the present disclosure. FIG. 3 is a view illustrating a configuration example of a semiconductor chip in which the imaging element 1 is formed, and is a view illustrating configurations of the pixel array unit 10 described in FIG. 1 and an end portion of the semiconductor chip. As described later, a pad for connection to an external circuit such as an image processing device and the like is arranged at an end portion of the semiconductor chip illustrated in FIG. 3. This pad is connected to the external circuit by wire bonding. Furthermore, the vertical drive unit 20, the column signal processing unit 30, the control unit 40, and the like, described in FIG. 1 are arranged around the pixel array unit 10. In FIG. 3, an illustration of the vertical drive unit 20 and the like has been omitted.

The imaging element 1 includes a semiconductor substrate 121, an insulating layer 131, a wiring layer 132, an insulating layer 141, a color filter 152, and an on-chip lens 151. The semiconductor substrate 121, the insulating layer 131, the wiring layer 132, the insulating layer 141, the color filter 152, and the on-chip lens 151 constitute the pixel 100. As described above, a plurality of pixels 100 is arranged in the pixel array unit 10. Furthermore, the imaging element 1 further includes a front surface side pad 201, a conductor layer 202, a back surface side pad 203, a cylindrical insulating film 204, a bonding wire 206, and a support substrate 160. The front surface side pad 201, the conductor layer 202, the back surface side pad 203, and the cylindrical insulating film 204 constitute a through electrode 200.

The semiconductor substrate 121 is a semiconductor substrate in which a semiconductor region configuring an element of the imaging element 1 such as the pixel circuit described in FIG. 2, or the like, is formed. The semiconductor substrate 121 includes, for example, silicon (Si). For example, a well region configured in a p-type is formed on the semiconductor substrate 121, and a semiconductor region (diffusion region) of the element is formed in the well region. For convenience, it is assumed that the well region is configured on the semiconductor substrate 121. In FIG. 3, the photoelectric conversion unit 101 and the MOS transistor 103 of the pixel circuit illustrated in FIG. 2 have been illustrated.

The photoelectric conversion unit 101 includes an n-type semiconductor region 122 and a p-type well region around the n-type semiconductor region 122. A photodiode is configured by a pn junction formed at an interface between the n-type semiconductor region 122 and the p-type well region. The MOS transistor 103 is a MOS transistor in which the n-type semiconductor region 122 and an n-type semiconductor region 123 are a source region and a drain region, respectively, and a p-type well region between the n-type semiconductor region 122 and the n-type semiconductor region 123 is a channel. A gate 124 is arranged adjacent to the channel with an insulating layer 131 interposed therebetween. Note that the insulating layer 131 between the gate 124 and the semiconductor substrate 121 corresponds to a gate oxide film.

The wiring layer 132 is a wiring that transmits a signal. The image signal generated by the pixel 100 or the control signal of the pixel 100 correspond to this signal. The signal lines 11 and 12 described in FIG. 2 include a plurality of wiring layers 132. For example, copper (Cu), tungsten (W), and aluminum (Al) can be used for the wiring layer 132. The insulating layer 131 is arranged on a front surface of the semiconductor substrate 121 to insulate the semiconductor substrate 121 and the wiring layer 132, the gate 124, and the like, from each other. Furthermore, the insulating layer 131 further insulates the wiring layers 132 from each other. The insulating layer 131 can include, for example, silicon oxide ($SiO_2$). A plurality of wiring layers 132 and insulating layers 131 can be stacked to form multilayer wirings. FIG. 3 illustrates the insulating layers 131 and the wiring layers 132 stacked in three layers. The wiring layers 132 arranged in different layers or the wiring layer 132 and the gate 124 are connected to each other by via plugs 133. The via plug 133 can include, for example, W or Cu. Note that the insulating layer 131 of FIG. 3 includes an insulating layer arranged in the gate oxide film described above or between the wiring layers 132. Note that the insulating layer 131 and the wiring layer 132 constitute a wiring region.

The insulating layer 141 is arranged on a back surface of the semiconductor substrate 121 to insulate and protect the semiconductor substrate 121. The insulating layer 141 can include, for example, $SiO_2$ or silicon nitride ($Si_3N_4$).

The on-chip lens 151 is a lens that collects incident light on the photoelectric conversion unit 101 (n-type semiconductor region 122). The color filter 152 is an optical filter that transmits light having a predetermined wavelength in the incident light. As the color filter 152, for example, a color filter that transmits red light, green light, and blue light can be used. Note that the imaging element 1 of FIG. 3 is an imaging element that images the incident light emitted to the back surface of the semiconductor substrate 121, which is a surface different from the front surface of the semiconductor substrate 121, which is a surface on which the wiring region is formed. Such an imaging element 1 is referred to as a back side irradiation-type imaging element.

As described above, at the end portion of the semiconductor chip constituting the imaging element 1, the pad for wire bonding is arranged on the back surface of the semiconductor substrate 121. Meanwhile, the wiring layer 132 connected to the pixel 100 and the like is arranged on the front surface of the semiconductor substrate 121. Therefore, it is necessary to connect the respective wirings on the front surface and the back surface of the semiconductor substrate 121 to each other. This connection is made by the through electrode 200. As described above, the through electrode 200 includes the front surface side pad 201, the conductor layer 202, the back surface side pad 203, and the cylindrical insulating film 204, and is formed in a through hole 209 formed in the semiconductor substrate 121. Such a through electrode 200 is referred to as a through silicon via (TSV).

The cylindrical insulating film 204 is an insulating film that is configured in a cylindrical shape penetrating the semiconductor substrate 121, and is an insulating film that insulates a conductor layer 202 or a front surface side pad 201 as described later and the semiconductor substrate 121 from each other. The cylindrical insulating film 204 is arranged inside the through hole (via hole) 209. Specifically, by forming the cylindrical insulating film 204 in the semiconductor substrate 121 and removing a region inside the cylindrical insulating film 204 in the semiconductor substrate 121, a cylindrical shape, that is, an inner side can be hollow. The cylindrical insulating film 204 can include an insulating material, for example, $SiO_2$. The cylindrical insulating film 204 formed of $SiO_2$ can be formed, for example, by forming a groove in the semiconductor substrate 121 and performing thermal oxidation. Furthermore, for example, the cylindrical insulating film 204 can be formed by atomic layer deposition (ALD). Furthermore, the cylindrical insulating film 204 can also include other silicon oxides or nitrides such as silicon nitride ($Si_3N_4$), silicon oxynitride (SiON), silicon oxide (SiOC) containing carbon, and the like. Furthermore, it is also possible to configure the cylindrical insulating film 204 by stacking the plurality of insulating materials.

The front surface side pad 201 is an electrode that is formed on the front surface of the semiconductor substrate 121. A conductor layer 202 as described later is arranged adjacent to a bottom surface of the front surface side pad 201, and the front surface side pad 201 is electrically connected to the conductor layer 202. The front surface side pad 201 can include, for example, a metal. Specifically, the front surface side pad 201 can include W, Al, Cu, or the like. Furthermore, a barrier metal can be arranged between the semiconductor substrate 121 and the front surface side pad 201. As the barrier metal, for example, titanium (Ti), titanium nitride (TiN), tantalum (Ta), tantalum nitride (TaN), ruthenium (Ru), cobalt (Co), and zirconium (Zr) can be used. The front surface side pad 201 is arranged inside the cylindrical insulating film 204. At this time, the front surface side pad 201 has a size smaller than that of the cylindrical insulating film 204. The insulating layer 131 is further arranged so as to cover a front surface of the front surface side pad 201. The front surface side pad 201 is insulated from the semiconductor substrate 121 by the cylindrical insulating film 204 and the insulating layer 131.

At the time of forming the through electrode 200, the front surface side pad 201 is formed adjacent to the front surface of the semiconductor substrate 121 inside the cylindrical insulating film 204. Next, the cylindrical insulating film 204 is arranged adjacent to the front surface side pad 201. Thereafter, the semiconductor substrate 121 in the region inside the cylindrical insulating film 204 described above is removed, and the conductor layer 202 is arranged inside the cylindrical insulating film 204. The semiconductor substrate 121 inside the cylindrical insulating film 204 is removed by a method different from plasma etching (for example, dry etching). Note that after the semiconductor substrate 121 adjacent to the front surface side pad 201 inside the cylindrical insulating film 204 is removed, the front surface side pad 201 is held by the insulating layer 131.

The semiconductor substrate 121 inside the cylindrical insulating film 204 can be removed by, for example, wet etching. The wet etching is an etching method of dissolving silicon constituting the semiconductor substrate 121 by a liquid chemical (etching solution). As the liquid chemical, an alkaline liquid chemical containing potassium hydroxide (KOH), ammonia, or the like can be used. Furthermore, for example, chemical dry etching can also be applied. The chemical dry etching is a method of performing discharge in a gas of a fluorine (F) compound to generate F radicals and performing etching by the F radicals. Since the discharge is performed at a place different from a chamber in which the semiconductor substrate 121 (wafer) is arranged, the etching can be performed without causing incidence of plasma on the wafer as in the dry etching.

The conductor layer 202 is a conductor that is arranged to penetrate the front surface and the back surface of the semiconductor substrate 121. The conductor layer 202 is arranged adjacent to an inner side of the cylindrical insulating film 204 and arranged adjacent to the front surface side pad 201 and the back surface side pad 203, and electrically connects the front surface side pad 201 and the back surface side pad 203 to each other. The conductor layer 202 can include Cu, for example, and can be formed by plating. Furthermore, the conductor layer 202 can include, for example, W and Al. At this time, the conductor layer 202 can be formed by chemical vapor deposition (CVD), physical vapor deposition (PVD), and ALD.

The back surface side pad 203 is an electrode that is formed on the back surface of the semiconductor substrate 121. The back surface side pad 203 is arranged adjacent to the conductor layer 202, and is electrically connected to the front surface side pad 201 via the conductor layer 202. The back surface side pad 203 can include a material similar to that of the front surface side pad 201 described above. Furthermore, the back surface side pad 203 of FIG. 3 is also used as a bonding pad to which a back surface side wiring and the bonding wire 206 are connected. Note that the support substrate 160 is a substrate that is adhered to the wiring region to support the imaging element 1. The support substrate 160 is a substrate that improves strength of the imaging element 1 in a manufacturing step of the imaging element 1. For example, a semiconductor wafer or a glass substrate can be used as the support substrate 160.

[Configuration of Back Surface Side Pad]

Figure 4A:
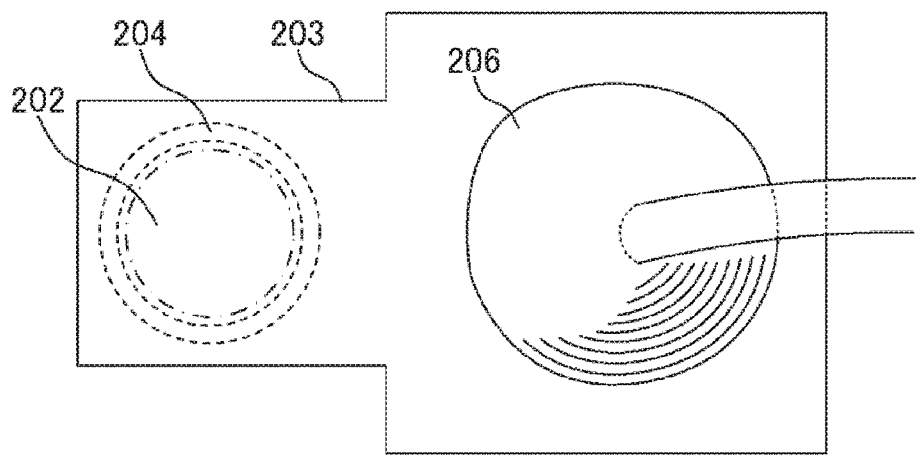
FIGS. 4A and 4B are views illustrating a configuration example of a back surface side pad according to the embodiment of the present disclosure.
Figure 4B:
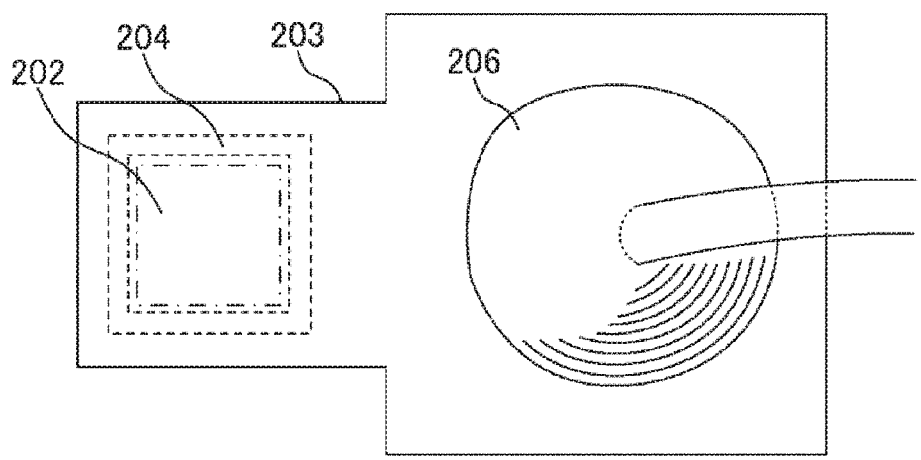

FIGS. 4A and 4B are views illustrating a configuration example of the back surface side pad according to the embodiment of the present disclosure. FIGS. 4A and 4B illustrate a state of the back surface side pad 203 to which the bonding wire 206 is connected. Note that a dotted line of FIGS. 4A and 4B indicate the cylindrical insulating film 204 and an alternate long and short dash line of FIGS. 4A and 4B indicate the conductor layer 202. As illustrated in FIGS. 4A and 4B, the back surface side pad 203 can be configured in a shape in which a pad portion constituting the through electrode 200 and a bonding pad are formed adjacent to each other. FIG. 4A is a view illustrating an example of a cylindrical insulating film 204 having an annular cross section. The cylindrical insulating film 204 can have a diameter of 30 to 500 µm and an insulating film thickness of 0.1 to 100 µm. Furthermore, the cylindrical insulating film 204 can be formed to have a depth of 2 to 100 µm. Furthermore, FIG. 4B is a view illustrating an example of a cylindrical insulating film 204 having a circular rectangular cross section.

The conductor layer 202 is arranged inside these cylindrical insulating films 204. The conductor layer 202 of a region in contact with the back surface side pad 203 can have a size smaller than that of the cylindrical insulating film 204. This is to prevent the cylindrical insulating film 204 from being damaged when an opening (opening 403 of FIG. 7C) for arranging the conductor layer 202 is formed in the insulating layer 141 on the back surface of the semiconductor substrate 121, as described later. Note that a shape of the cylindrical insulating film 204 is not limited to this example. For example, a cylindrical insulating film 204 having an octagonal cross section can be used.

[Manufacturing Method of Imaging Element]

Figure 5A:
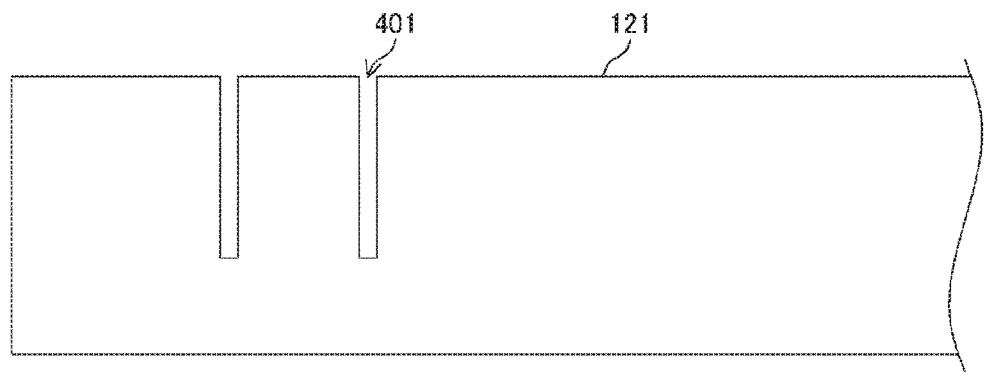
FIGS. 5A, 5B, 5C, and 5D are views illustrating an example of a manufacturing method of the imaging element according to the first embodiment of the present disclosure.
Figure 5B:
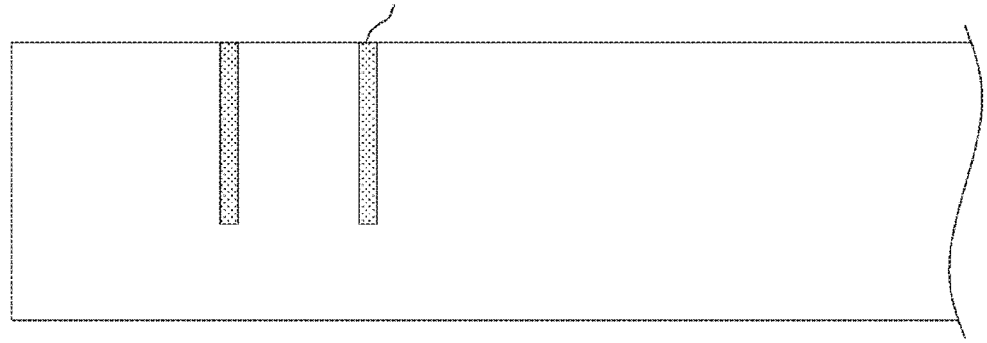

FIGS. 5A, 5B, 5C, 5D, 6A, 6B, 6C, 7A, 7B, 7C, 8A, 8B, and 8C are views illustrating an example of a manufacturing method of the imaging element according to the first embodiment of the present disclosure. First, a cylindrical groove 401 is formed in the semiconductor substrate 121 at a position where the through electrode 200 is formed. The cylindrical groove 401 can be formed, for example, by arranging a resist in which an opening is formed at a position of the groove 401 by lithography on the front surface of the semiconductor substrate 121 and performing dry etching. At this time, the groove 401 can be formed at a depth where the groove 401 does not penetrate the semiconductor substrate 121. This is to thin the semiconductor substrate 121 in a subsequent step (FIG. 5A). Next, an insulating material which is a material of the cylindrical insulating film 204 is arranged in the groove 401. This can be performed by the thermal oxidation described above, or the like (FIG. 5B). As a result, the cylindrical insulating film 204 can be formed.

Figure 5C:
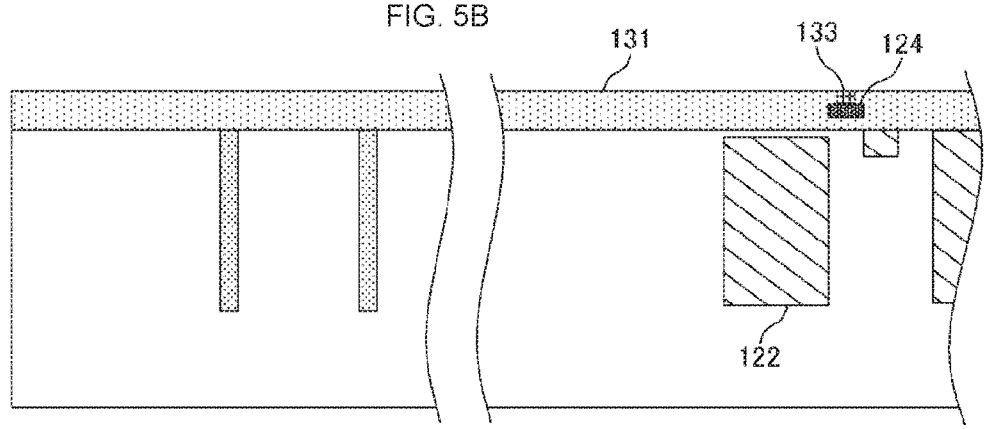

Next, the n-type semiconductor region 122 and the like are formed in the semiconductor substrate 121 by ion implantation or the like. Next, a gate insulating film (insulating layer 131) and the gate 124 are sequentially formed, and an element is formed on the semiconductor substrate 121. Thereafter, the insulating layers 131 are stacked to form the via plug 133. The formation of the insulating layer 131 can be performed by forming a film of a material such as SiO2 by CVD or the like. The via plug 133 can be formed by arranging a metal such as W or the like in a via hole formed in the insulating layer 131 and planarizing a front surface. Note that the planarization can be performed by, for example, chemical mechanical polishing (CMP) (FIG. 5C).

Figure 5D:
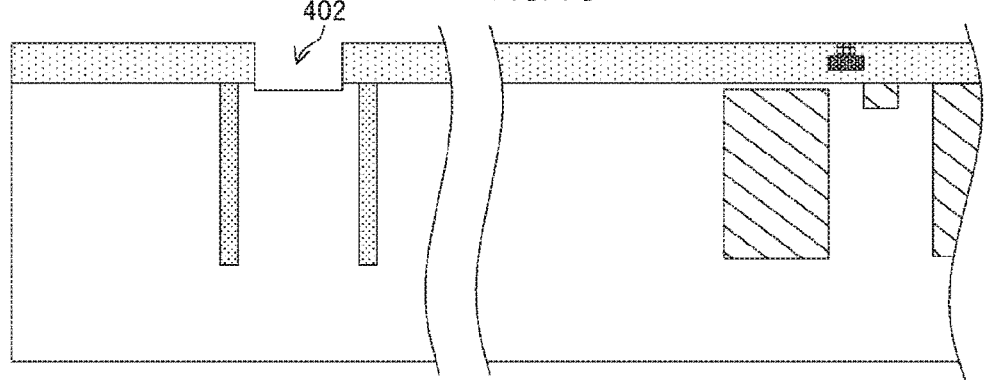
Figure 6A:
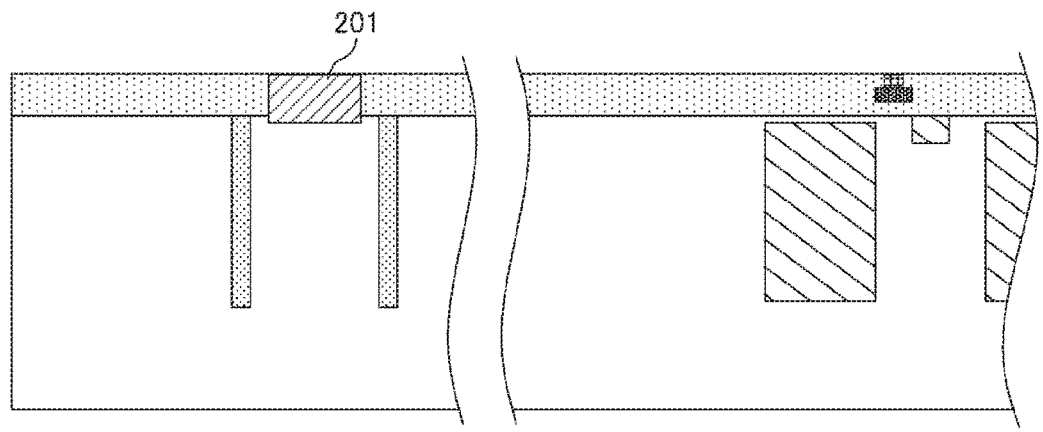
FIGS. 6A, 6B, and 6C are views illustrating an example of a manufacturing method of the imaging element according to the first embodiment of the present disclosure.

Next, an opening 402 is formed in the insulating layer 131 at a position where the front surface side pad 201 is formed. The opening 402 is formed in a region inside the cylindrical insulating film 204. The opening 402 can be formed by arranging a resist in which an opening is formed at a position of the opening 402 and performing dry etching to remove the insulating layer 131 adjacent to the opening, similarly to FIG. 5A. At this time, the front surface of the semiconductor substrate 121 may be shallowly etched (FIG. 5D). Next, a barrier metal and a metal film, which is a material of the front surface side pad 201, such as Cu or the like, are sequentially formed in the opening 402 to form the front surface side pad 201 (FIG. 6A). As a result, the front surface side pad 201 can be arranged. Steps represented by FIGS. 5D and 6A correspond to a front surface side pad arranging step described in the claims.

Figure 6B:
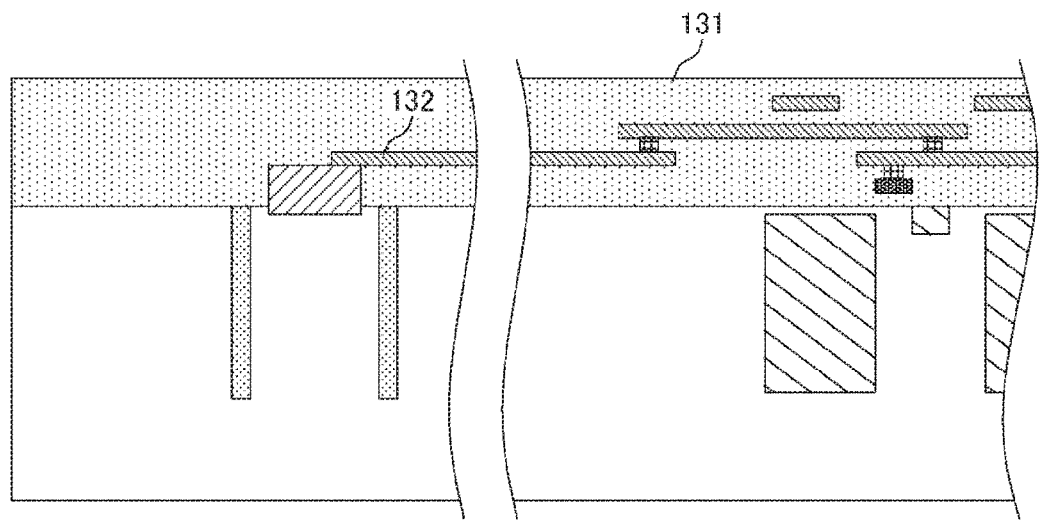

Next, the insulating layers 131 and the wiring layers 132 are stacked to form a wiring region. As a result, the element and the front surface side pad 201 are connected to each other by the wiring layer 132. Furthermore, the insulating layer 131 covering the front surface side pad 201 can be arranged on the front surface of the semiconductor substrate 121 (FIG. 6B). A step represented by FIG. 6B corresponds to an insulating layer arranging step described in the claims.

Figure 6C:
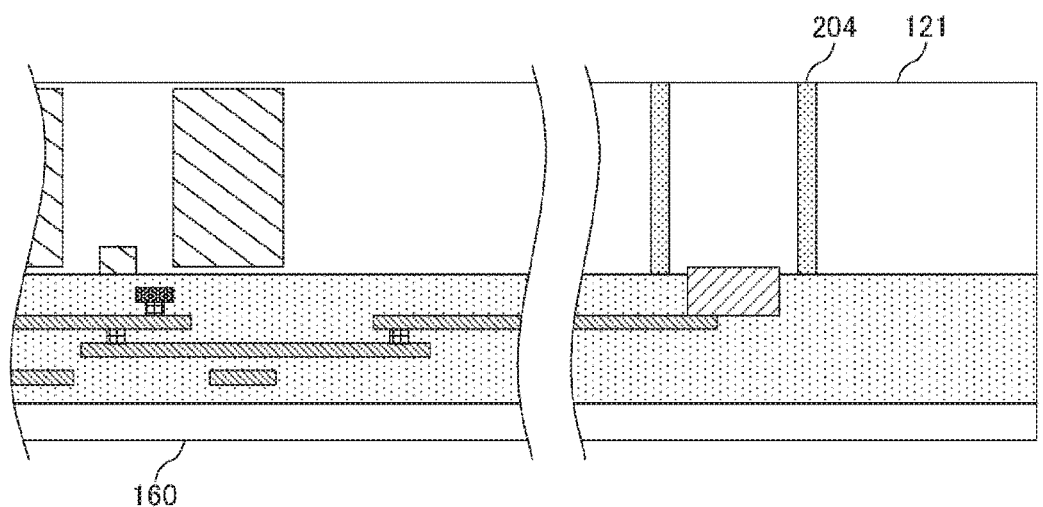

Next, the support substrate 160 is adhered to the imaging element 1, and the front and back are reversed. Next, the back surface of the semiconductor substrate 121 is ground and thinned. The grinding of the back surface is performed up to a position of an end portion on a back surface side of the cylindrical insulating film 204. The grinding can be performed by, for example, CMP or etching (dry etching and wet etching). As a result, the cylindrical insulating film 204 is configured in a shape in which the cylindrical insulating film 204 penetrates the semiconductor substrate 121 (FIG. 6C). Steps represented by FIGS. 5A, 5B and 6C correspond to a cylindrical insulating film arranging step described in the claims.

Figure 7A:
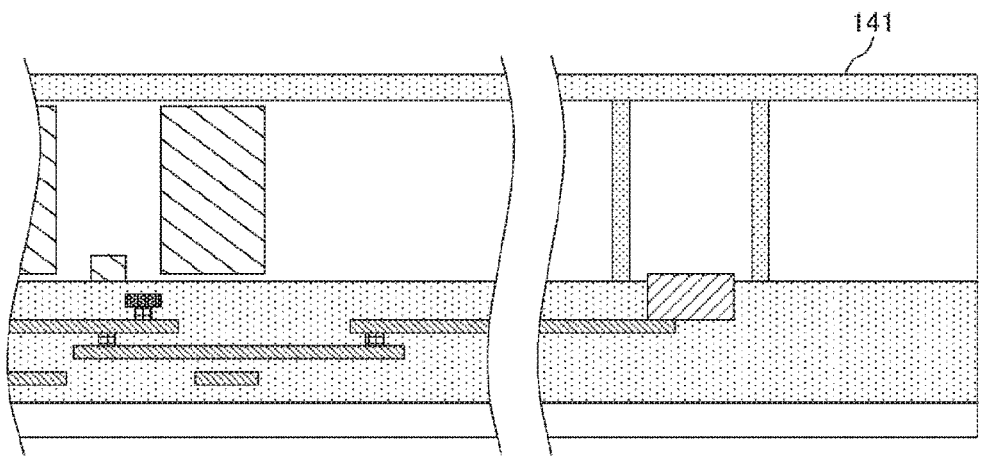
FIGS. 7A, 7B, and 7C are views illustrating an example of a manufacturing method of the imaging element according to the first embodiment of the present disclosure.
Figure 7B:
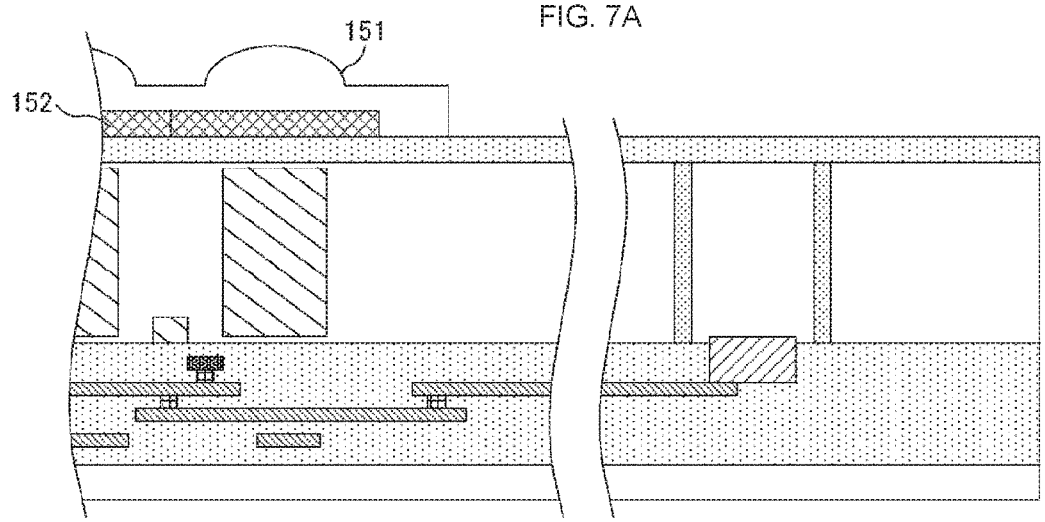

Next, the insulating layer 141 is formed on the back surface of the semiconductor substrate 121. This can be performed, similarly to the formation of the insulating layer 131 (FIG. 7A). Next, the color filter 152 and the on-chip lens 151 are formed in the pixel 100 of the pixel array unit 10 (FIG. 7B).

Figure 7C:
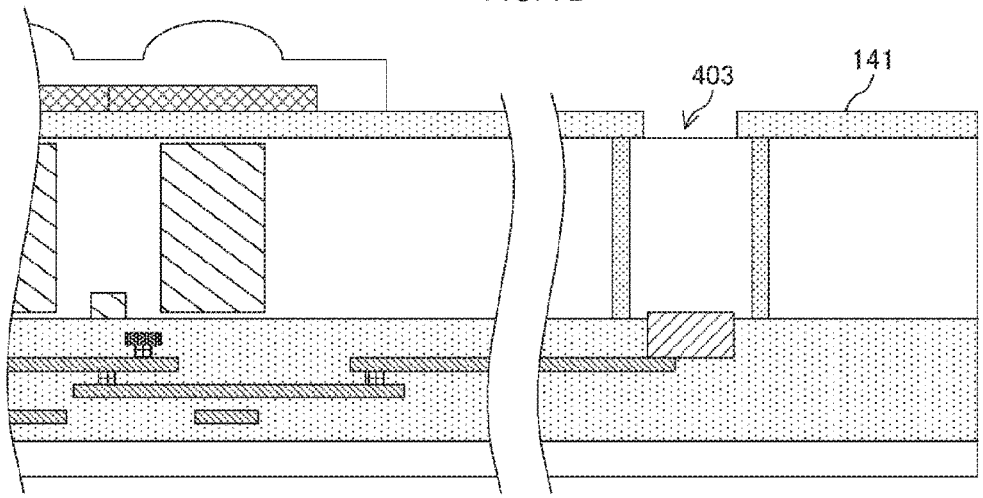

Next, an opening 403 is formed in the insulating layer 141 at a position where the back surface side pad 203 is formed. The opening 403 is formed in a region inside the cylindrical insulating film 204. At this time, the opening 403 is formed to have a size smaller than an inner diameter of the cylindrical insulating film 204. The formation of the opening 403 can be performed by arrangement of a resist and dry etching, similarly to the formation of the opening 402 (FIG. 7C).

Figure 8A:
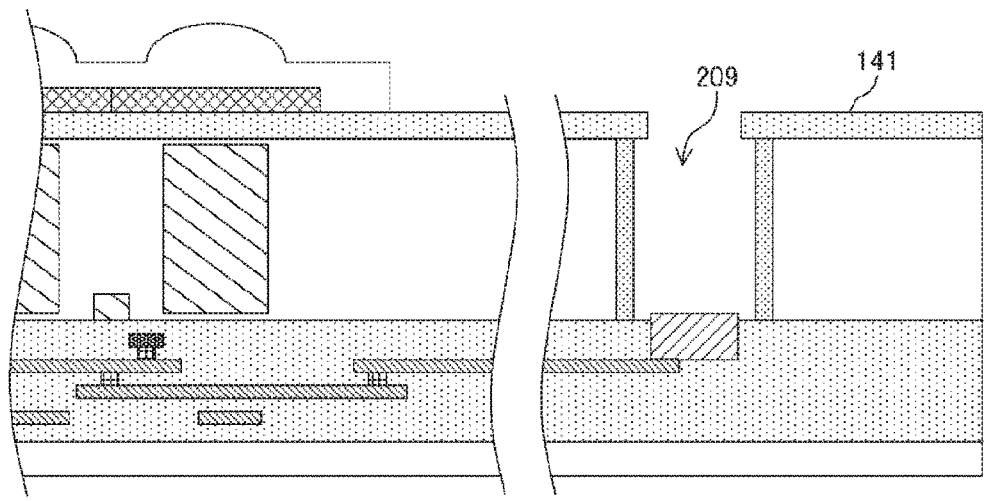
FIGS. 8A, 8B, and 8C are views illustrating an example of a manufacturing method of the imaging element according to the first embodiment of the present disclosure.

Next, the silicon constituting the semiconductor substrate 121 inside the cylindrical insulating film 204 is removed. As a result, the through hole 209 can be formed and a bottom surface of the front surface side pad 201 can be exposed. The removal of the silicon constituting the semiconductor substrate 121 can be performed by a method (wet etching or chemical dry etching) different from the plasma etching as described above. As a result, the semiconductor substrate 121 inside the cylindrical insulating film 204 can be removed (FIG. 8A). A step represented by FIG. 8A corresponds to a semiconductor substrate removing step described in the claims.

Figure 8B:
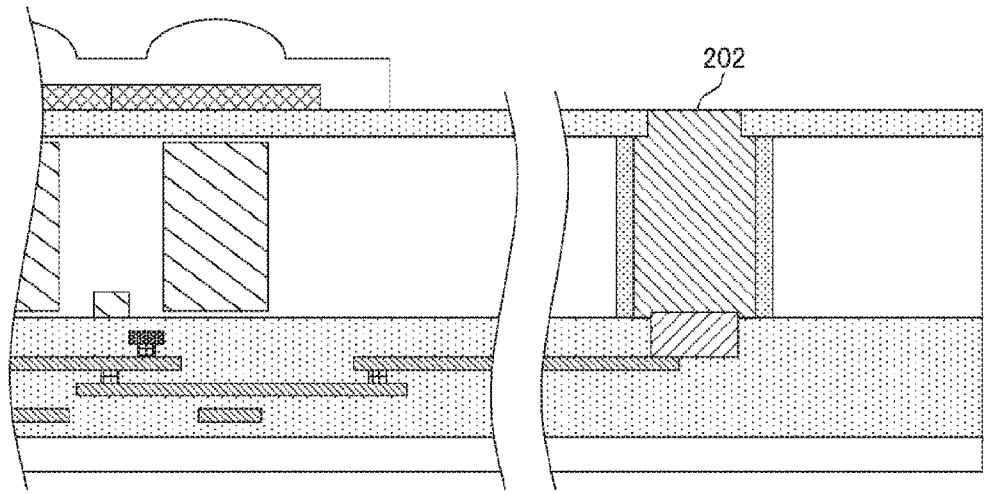
Figure 8C:
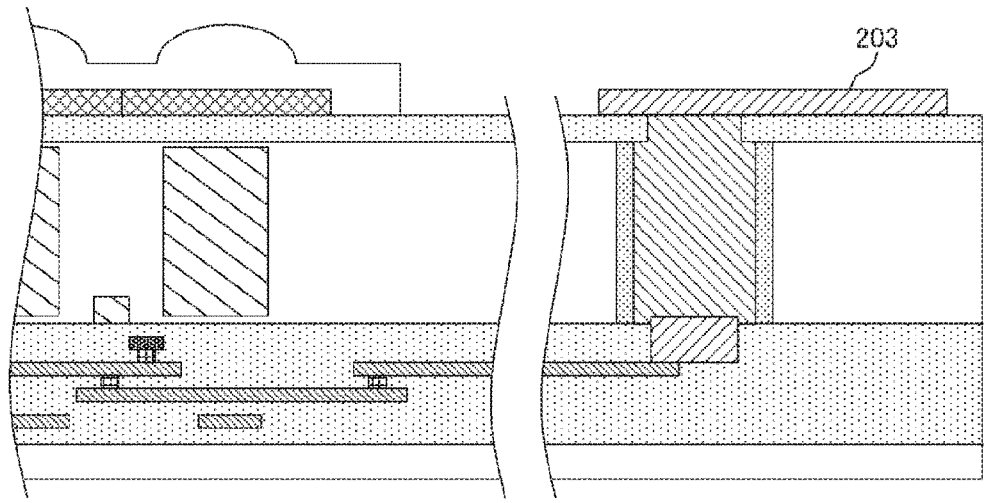

Next, the conductor layer 202 is arranged in the through hole 209. This can be performed by forming a film of a barrier metal inside the through hole 209 and then forming a film of Cu by electroplating, for example. Note that at the time of performing the electroplating, a seed layer for electroplating may be formed on a front surface of the barrier metal. Note that in order to decrease a resistance value between the front surface side pad 201 and the conductor layer 202, reduction treatment may be performed on the bottom surface of the front surface side pad 201 before the barrier metal is arranged. As a result, the conductor layer 202 adjacent to the front surface side pad 201 inside the cylindrical insulating film 204 can be arranged (FIG. 8B). A step represented by FIG. 8B corresponds to a conductor layer arranging step described in the claims.

Next, the back surface side pad 203 is arranged adjacent to the conductor layer 202. The back surface side pad 203 can be arranged by a step similar to that of the front surface side pad 201 described above (FIG. 8C). A step represented by FIG. 8C corresponds to a back surface side pad arranging step described in the claims.

The through electrode 200 can be formed by the steps described above. The cylindrical insulating film 204 is formed in the semiconductor substrate 121, and the front surface side pad 201 is formed on the front surface of the semiconductor substrate 121 inside the cylindrical insulating film 204. At this time, as represented by FIGS. 5D and 6A, the front surface side pad 201 is formed adjacent to the front surface of the semiconductor substrate 121. That is, an insulating material such as SiO2 or the like is not interposed between the semiconductor substrate 121 and the front surface side pad 201. Therefore, the removal of the semiconductor substrate 121 inside the cylindrical insulating film 204 represented by FIG. 8A can be easily performed. This is because it is possible to apply selective etching that does not remove the insulating material constituting the cylindrical insulating film 204 while removing the silicon.

On the other hand, in a case of a configuration in which the insulating layer 131 is arranged between the semiconductor substrate 121 and the front surface side pad 201, it is necessary to remove the insulating layer 131 adjacent to the front surface side pad 201 after removing the semiconductor substrate 121 inside the cylindrical insulating film 204. However, since the insulating layer 131 includes the same material as that of the cylindrical insulating film 204, the cylindrical insulating film 204 is also removed when the insulating layer 131 is removed, such that the conductor layer 202 and the semiconductor substrate 121 are short-circuited.

As described with reference to FIG. 8A, the wet etching or the chemical dry etching can be adopted to remove the semiconductor substrate 121 inside the cylindrical insulating film 204. Since the cylindrical insulating film 204 serves as an etching barrier to prevent the semiconductor substrate 121 from being etched, it is possible to form the through hole 209 having a high aspect ratio even in a case where an isotropic etching method is adopted.

By using a configuration in which the cylindrical insulating film 204 is arranged to limit an etching range of the semiconductor substrate 121 and the insulating material is not arranged between the front surface side pad 201 and the semiconductor substrate 121, the through hole 209 can be formed without performing dry etching. Since the dry etching is not used, it is possible to prevent the imaging element 1 from being damaged in a manufacturing step. In the dry etching, etching is performed by directly injecting a plasma-like etching gas into a wafer. Fine etching by anisotropic etching is possible, but charging of the wafer due to an ionized gas occurs. Specifically, the front surface side pad 201 and the element connected to the front surface side pad 201 are charged, such that deterioration due to a change in characteristics or partial dielectric breakdown of a MOS transistor occurs. It is possible to prevent charging of a high voltage by adding a protection diode, but a degree of integration is reduced.

Furthermore, in a case of using the dry etching, it is necessary to add a cleaning step of the bottom surface of the front surface side pad 201 after etching. This is because a reaction product by F contained in the etching gas is deposited. By forming the through hole 209 using the wet etching or the like as described above, it is possible to prevent deterioration or the like of the element and simplify a manufacturing step. It is possible to manufacture the imaging element 1 that has adopted a via-last method.

As described above, in the imaging element 1 according to the first embodiment of the present disclosure, the cylindrical insulating film 204 is formed in the semiconductor substrate 121, and the front surface side pad 201 is formed adjacent to the front surface of the semiconductor substrate 121 inside the cylindrical insulating film 204. Thereafter, the semiconductor substrate 121 inside the cylindrical insulating film 204 is removed from the back surface of the semiconductor substrate 121 by the etching to form the through hole 209. As such, it is possible to adopt a configuration in which the insulating material is not arranged between the front surface side pad 201 and the semiconductor substrate 121, and it is thus possible to prevent deterioration of the imaging element 1 at the time of forming the through hole 209.

2. SECOND EMBODIMENT

The imaging element 1 according to the first embodiment described above has been configured in a shape in which the through hole 209 is filled with the conductor layer 202. On the other hand, an imaging element 1 according to a second embodiment of the present disclosure is different from the first embodiment described above in that a thin film-like conductor layer similar to a wiring layer is used.

[Cross-Sectional Configuration of Imaging Element]

Figure 9:
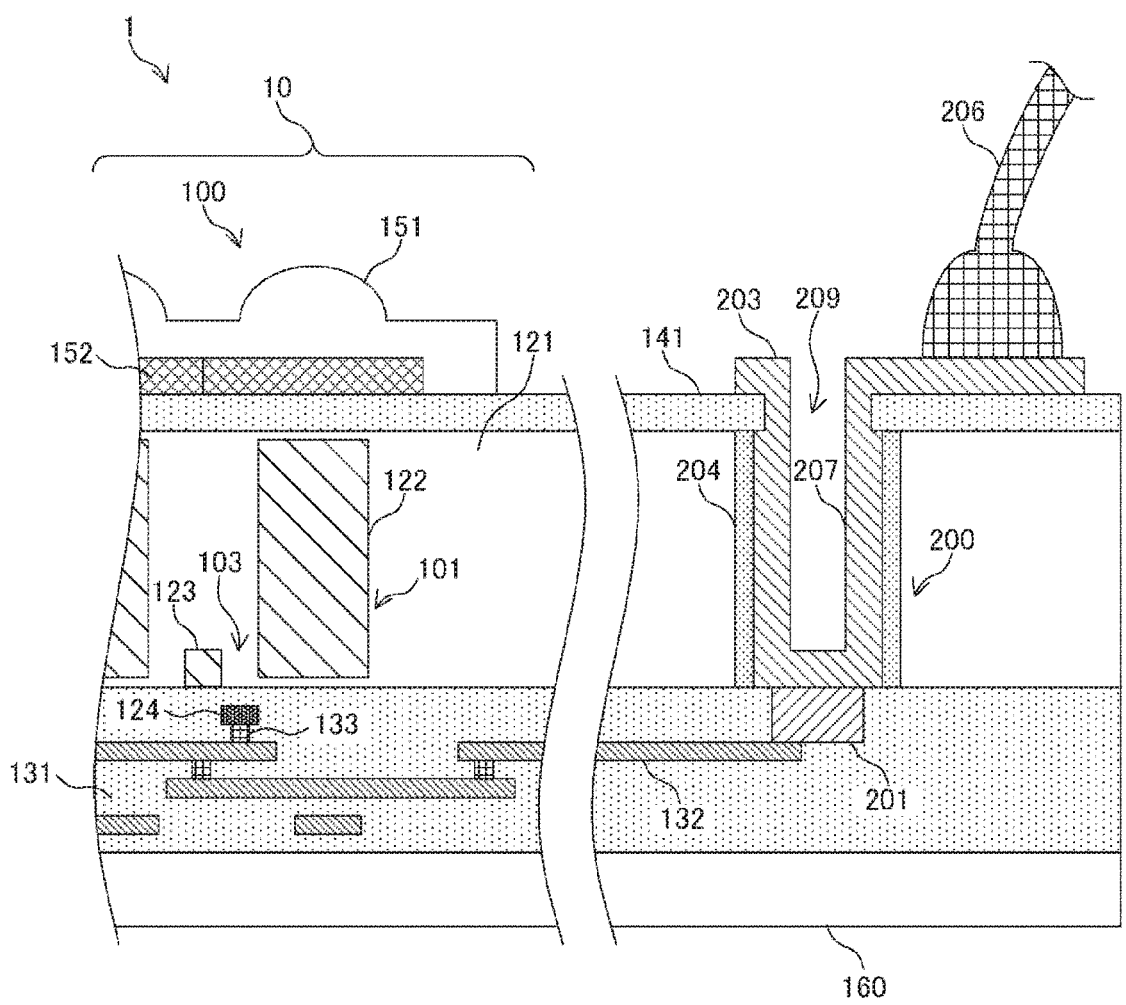
FIG. 9 is a cross-sectional view illustrating a configuration example of an imaging element according to a second embodiment of the present disclosure.

FIG. 9 is a cross-sectional view illustrating a configuration example of an imaging element according to a second embodiment of the present disclosure. The imaging element 1 of FIG. 9 is different from the imaging element 1 described in FIG. 3 in that a conductor layer 207 is used instead of the conductor layer 202 of the through electrode 200. The conductor layer 207 in FIG. 9 can be configured as a film having the same thickness as that of a back surface side pad 203. Furthermore, the conductor layer 207 and the back surface side pad 203 can be simultaneously formed. By using such a conductor layer 207, a step of arranging a conductor in a through hole 209 can be shortened. In a case of forming a through electrode 200 having a large diameter, it becomes possible to simplify the formation of the through electrode 200.

A configuration of the imaging element 1 other than those described above is similar to that of the imaging element 1 described in the first embodiment of the present disclosure, and a description thereof will thus be omitted.

As described above, in the imaging element 1 according to the second embodiment of the present disclosure, the formation of the through electrode 200 can be simplified by using the thin film-like conductor layer 207.

3. THIRD EMBODIMENT

The imaging element 1 according to the first embodiment described above has used one front surface side pad 201. On the other hand, an imaging element 1 according to a third embodiment of the present disclosure is different from the first embodiment described above in that a plurality of front surface side pads is used.

[Cross-Sectional Configuration of Imaging Element]

Figure 10:
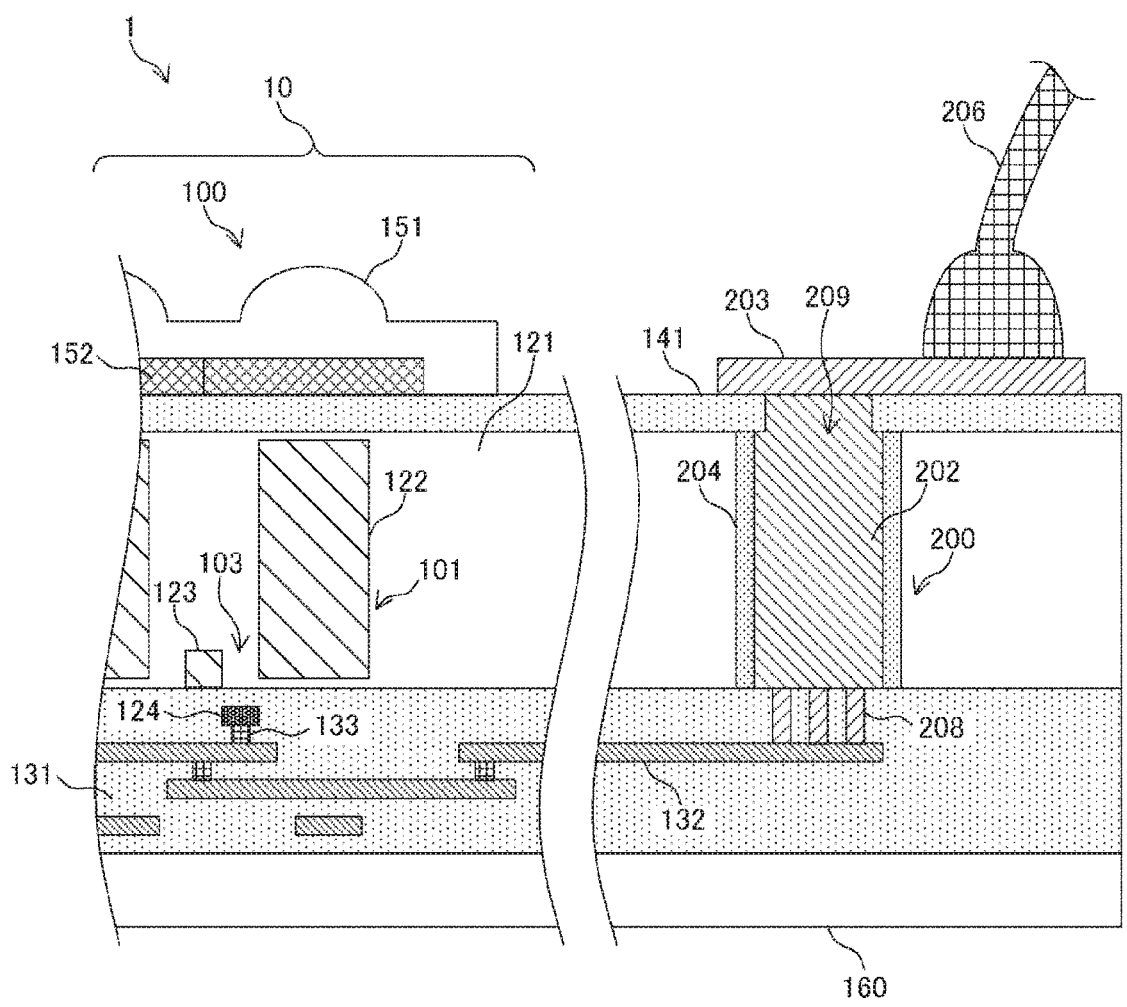
FIG. 10 is a cross-sectional view illustrating a configuration example of an imaging element according to a third embodiment of the present disclosure.

FIG. 10 is a cross-sectional view illustrating a configuration example of an imaging element according to a third embodiment of the present disclosure. The imaging element 1 of FIG. 10 is different from the imaging element 1 described in FIG. 3 in that a plurality of front surface side pads 208 is used instead of the front surface side pads 201. The front surface side pad 208 in FIG. 10 is a pad formed to have a relatively small diameter. Therefore, the plurality of front surface side pads 208 can be formed by a manufacturing process similar to that of a wiring layer 132. A manufacturing step can also be used in common for the plurality of front surface side pads 208 and the wiring layer 132, such that a manufacturing step of a through electrode 200 can be simplified. Furthermore, by arranging the plurality of front surface side pads 208, it is possible to reduce an increase in a resistance value between the wiring layer 132 and a conductor layer 202.

A configuration of the imaging element 1 other than those described above is similar to that of the imaging element 1 described in the first embodiment of the present disclosure, and a description thereof will thus be omitted.

As described above, in the imaging element 1 according to the third embodiment of the present disclosure by using the front surface side pads 208 having the relatively small diameter, the manufacturing step similar to that of the wiring layer 132 can be applied, such that the manufacturing step of the through electrode 200 can be simplified.

4. FOURTH EMBODIMENT

In the imaging element 1 according to the first embodiment described above, the cylindrical insulating film 204 has been formed before the element of the semiconductor substrate 121 is formed. On the other hand, an imaging element 1 according to a fourth embodiment of the present disclosure is different from the first embodiment described above in that a cylindrical insulating film 204 is formed after an element of a semiconductor substrate 121 is formed.

[Manufacturing Method of Imaging Element]

Figure 11A:
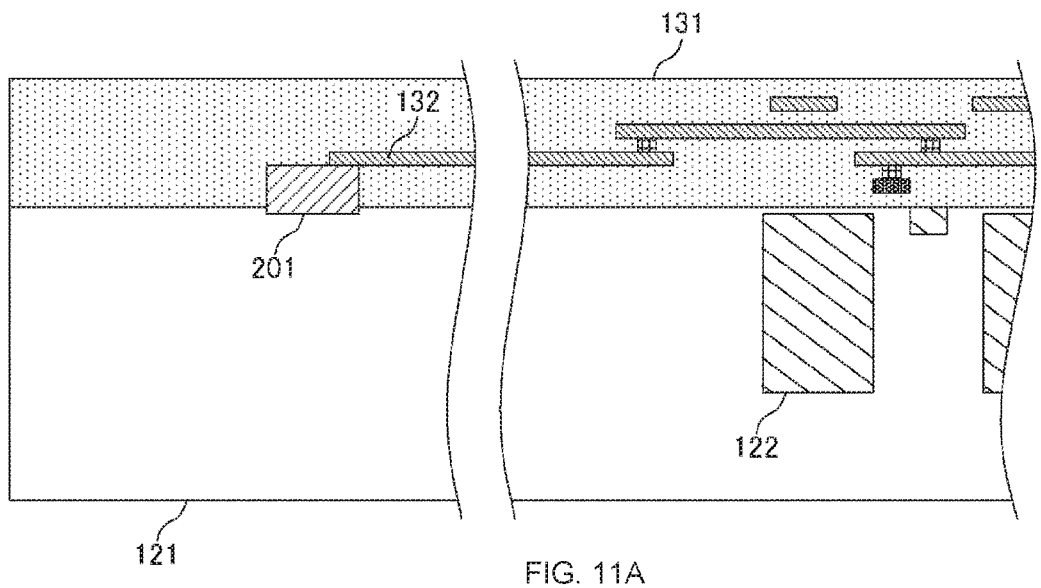
FIGS. 11A, 11B, and 11C are views illustrating an example of a manufacturing method of an imaging element according to a fourth embodiment of the present disclosure.
Figure 11B:
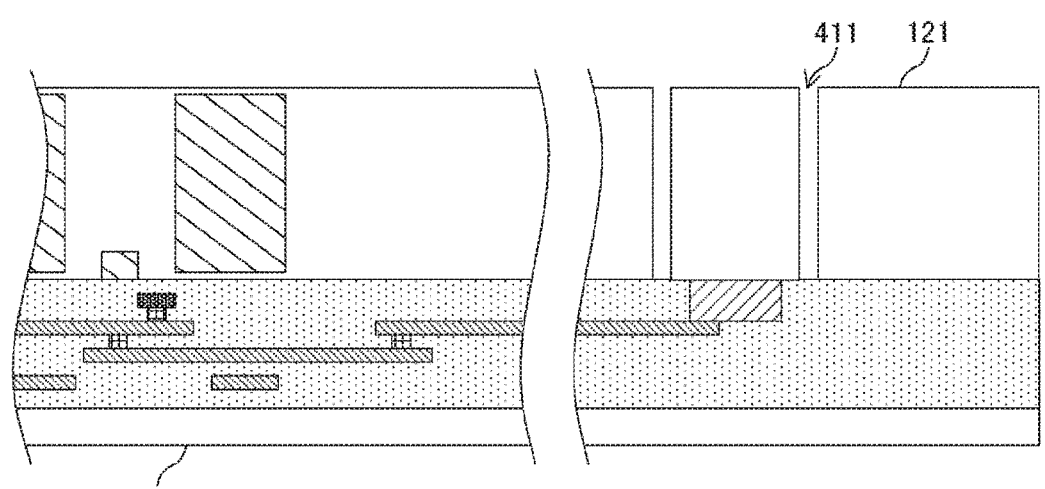
Figure 11C:
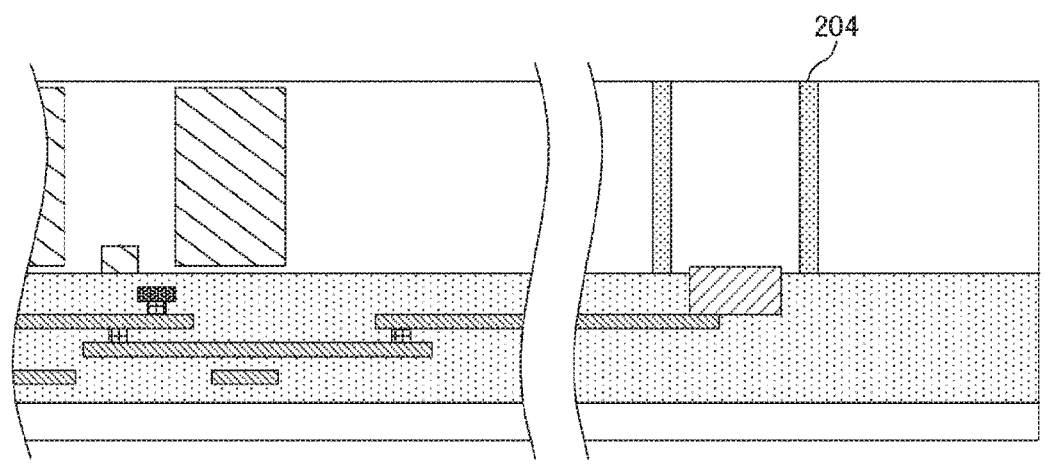

FIGS. 11A, 11B, and 11C are views illustrating an example of a manufacturing method of an imaging element according to a fourth embodiment of the present disclosure. First, an element is formed on the semiconductor substrate 121. That is, an n-type semiconductor region 122 or a gate is formed, and a front surface side pad 201 is arranged. Next, a wiring region is formed (FIG. 11A). As a result, the front surface side pad 201 adjacent to the semiconductor substrate 121 can be formed. A step represented by FIG. 11A corresponds to a front surface side pad forming step described in the claims.

Next, a support substrate 160 is adhered, the front and back are reversed, and a back surface of the semiconductor substrate 121 is ground and thinned. Next, a groove 411 is formed at a position surrounding the front surface side pad 201 arranged on a front surface of the semiconductor substrate 121. The groove 411 is configured in a cylindrical shape penetrating the semiconductor substrate 121 (FIG. 11B). Next, an insulating material which is a material of a cylindrical insulating film 204 is arranged in the groove 411 (FIG. 11C). As a result, the cylindrical insulating film 204 can be formed. Steps represented by FIGS. 11B and 11C correspond to a cylindrical insulating film arranging step described in the claims. Thereafter, a process shifts to the manufacturing step of the imaging element 1 described in FIG. 7A.

As such, in the manufacturing method of FIGS. 11A, 11B, and 11C, after an element region or the wiring region of the semiconductor substrate 121 is formed, the formation of the cylindrical groove 411 and the arrangement of the insulating material are performed from the back surface of the semiconductor substrate 121 to form the cylindrical insulating film 204. As a result, the formation of the element region and formation of a through electrode 200 other than the front surface side pad 201 can be performed separately. For example, the element region and the through electrode 200 other than the front surface side pad 201 may be manufactured by different business offices. It becomes possible to diversify suppliers of the semiconductor substrate 121 in which the element region is formed.

A configuration of the imaging element 1 other than those described above is similar to that of the imaging element 1 described in the first embodiment of the present disclosure, and a description thereof will thus be omitted.

As described above, in the imaging element 1 according to the fourth embodiment of the present disclosure, by forming the cylindrical groove 411 from the back surface of the semiconductor substrate 121, manufacturing steps of a front surface side and a back surface side of the semiconductor substrate 121 can be performed separately.

5. FIFTH EMBODIMENT

In the imaging element 1 according to the first embodiment described above, the semiconductor chip constituting the imaging element 1 has been connected to and mounted on a package by wire bonding. On the other hand, an imaging element 1 according to a fifth embodiment of the present disclosure is different from the first embodiment described above in that the imaging element is mounted by a solder ball arranged on a bottom surface.

[Cross-Sectional Configuration of Imaging Element]

Figure 12:
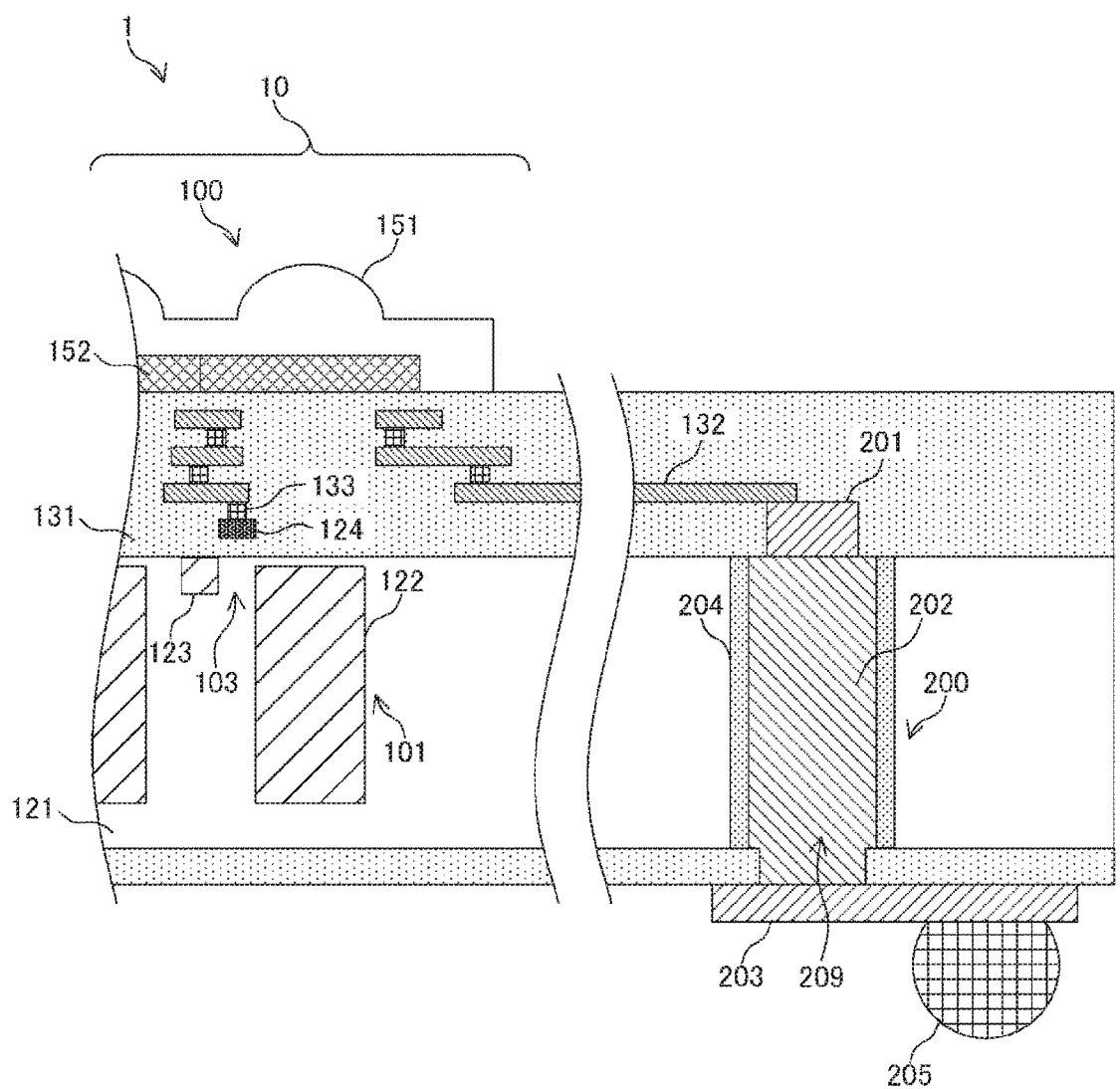
FIG. 12 is a cross-sectional view illustrating a configuration example of an imaging element according to a fifth embodiment of the present disclosure.

FIG. 12 is a cross-sectional view illustrating a configuration example of an imaging element according to a fifth embodiment of the present disclosure. The imaging element 1 of FIG. 12 is different from the imaging element 1 described in FIG. 3 in the following points. As the imaging element 1 of FIG. 12, a front side irradiation-type imaging element in which incident light is emitted to a surface of a semiconductor substrate 121 on which a wiring region is formed. Furthermore, the imaging element 1 of FIG. 12 is mounted by a solder ball instead of the wire bonding.

In the imaging element 1 of FIG. 12, an image signal generated by a pixel 100 is transmitted to a back surface side pad 203 arranged on a back surface of the semiconductor substrate 121 via a through electrode 200. A solder ball 205 is arranged on the back surface side pad 203, and the imaging element is mounted and used on a circuit board of an imaging device or the like via the solder ball 205. Since the mounting is performed by the solder ball arranged on a back surface of a semiconductor chip constituting the imaging element 1, the imaging element can have a size smaller than that of the imaging element 1 illustrated in FIG. 3, and a mounting area of the imaging element can be reduced.

Note that the configuration of the semiconductor device according to the present disclosure is not limited to this example. For example, the present disclosure can be applied to a semiconductor device configured in a miniaturized package such as a chip size package (CSP) or the like.

A configuration of the imaging element 1 other than those described above is similar to that of the imaging element 1 described in the first embodiment of the present disclosure, and a description thereof will thus be omitted.

As described above, in the imaging element 1 according to the fifth embodiment of the present disclosure, the irradiation-type imaging element 1 is used and is mounted by the solder ball, such that the imaging element 1 may be miniaturized.

6. APPLICATION EXAMPLE TO CAMERA

The present technology can be applied to various products. For example, the present technology may be realized as an imaging element mounted in an imaging device such as a camera or the like.

Figure 13:
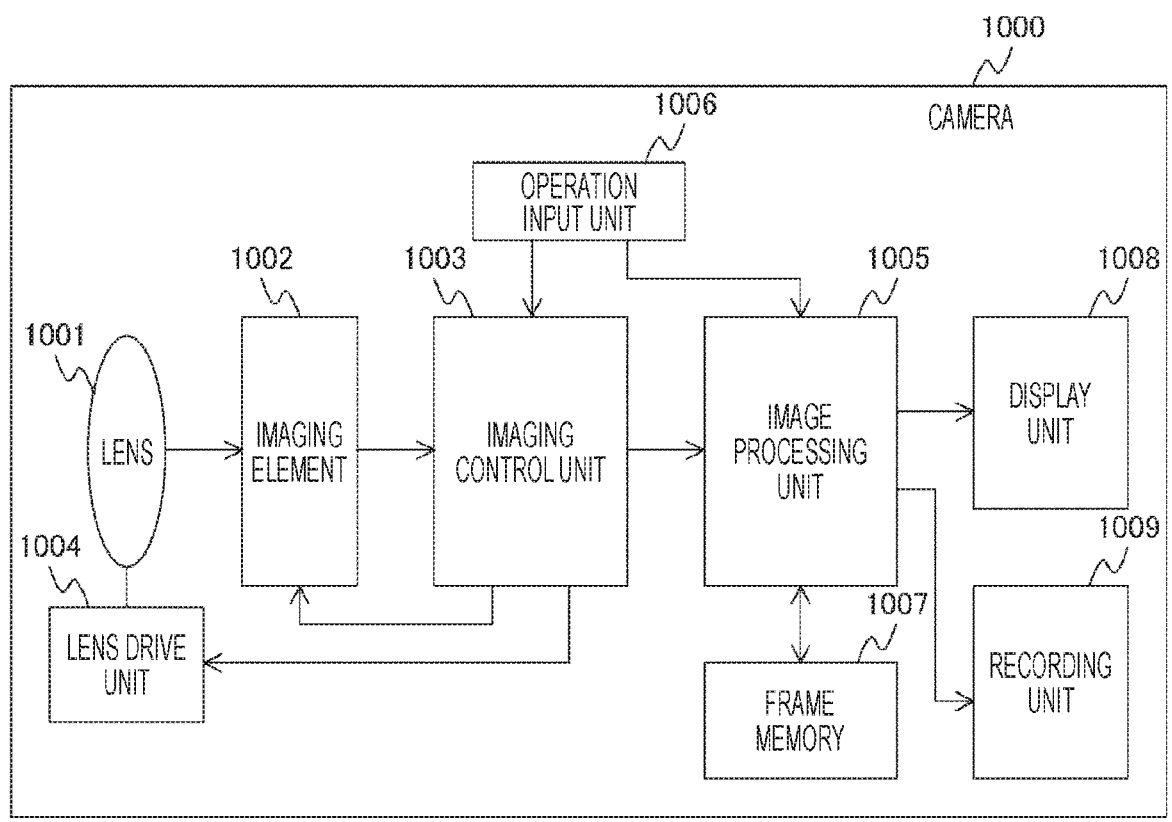
FIG. 13 is a block diagram illustrating a schematic configuration example of a camera that is an example of an imaging device to which the present technology can be applied.

FIG. 13 is a block diagram illustrating a schematic configuration example of a camera that is an example of an imaging device to which the present technology can be applied. The camera 1000 illustrated in FIG. 13 includes a lens 1001, an imaging element 1002, an imaging control unit 1003, a lens drive unit 1004, an image processing unit 1005, an operation input unit 1006, a frame memory 1007, a display unit 1008, and a recording unit 1009.

The lens 1001 is an image capturing lens of the camera 1000. The lens 1001 collects light from a subject and makes the collected light incident on an imaging element 1002 as described later to form an image of the subject.

The imaging element 1002 is a semiconductor element that images the light from the subject collected by the lens 1001. The imaging element 1002 generates an analog image signal corresponding to the irradiated light, converts the analog image signal into a digital image signal, and outputs the digital image signal.

The imaging control unit 1003 controls imaging by the imaging element 1002. The imaging control unit 1003 controls the imaging element 1002 by generating a control signal and outputting the control signal to the imaging element 1002. Furthermore, the imaging control unit 1003 can perform autofocus in the camera 1000 on the basis of the image signal output from the imaging element 1002. Here, the autofocus is a system that detects a focal position of the lens 1001 and automatically adjusts the focal position. As the autofocus, a manner (image plane phase difference autofocus) of detecting the focal position by detecting an image plane phase difference by phase difference pixels arranged in the imaging element 1002 can be used. Furthermore, a manner (contrast autofocus) of detecting a position where a contrast of an image is highest as the focal position can also be applied. The imaging control unit 1003 performs the autofocus by adjusting a position of the lens 1001 via the lens drive unit 1004 on the basis of the detected focal position. Note that the imaging control unit 1003 can be constituted by, for example, a digital signal processor (DSP) equipped with firmware.

The lens drive unit 1004 drives the lens 1001 on the basis of the control of the imaging control unit 1003. The lens drive unit 1004 can drive the lens 1001 by changing the position of the lens 1001 using a built-in motor.

The image processing unit 1005 processes the image signal generated by the imaging element 1002. For example, demosaicing for generating an image signal of a lacking color among image signals corresponding to red, green, and blue for every pixel, noise reduction for removing noise of the image signal, encoding of the image signal, and the like, correspond to this processing. The image processing unit 1005 can be constituted by, for example, a microcomputer equipped with firmware.

The operation input unit 1006 receives an operation input from a user of the camera 1000. As the operation input unit 1006, for example, a push button or a touch panel can be used. The operation input received by the operation input unit 1006 is transmitted to the imaging control unit 1003 and the image processing unit 1005. Thereafter, processing according to the operation input, for example, processing such as imaging of the subject, or the like is started.

The frame memory 1007 is a memory that stores a frame which is an image signal for one screen. The frame memory 1007 is controlled by the image processing unit 1005, and holds frames in the course of image processing.

The display unit 1008 displays an image processed by the image processing unit 1005. For the display unit 1008, for example, a liquid crystal panel can be used.

The recording unit 1009 records the image processed by the image processing unit 1005. For the recording unit 1009, for example, a memory card or a hard disk can be used.

The camera to which the present invention can be applied has been described hereinabove. The present technology can be applied to the imaging element 1002 among the configurations described above. Specifically, the imaging element 1 described in FIG. 1 can be applied to the imaging element 1002. By applying the imaging element 1 to the imaging element 1002, deterioration of the imaging element 1 in a manufacturing step can be prevented.

Note that the camera has been described by way of example herein, but the technology according to the present invention may be applied to the others, for example, a monitoring device and the like.

Finally, a description of each of the embodiments described above is an example of the present disclosure, and the present disclosure is not limited to the embodiments described above. Therefore, it goes without saying that various modifications other than the embodiments described above can be made according to a design and the like without deviating from the technical idea of the present disclosure.

Note that the present technology can also adopt the following configuration.

(1) A semiconductor device including:
a cylindrical insulating film that is configured in a cylindrical shape penetrating a semiconductor substrate;
a front surface side pad that is formed adjacent to a front surface of the semiconductor substrate inside the cylindrical insulating film;
a conductor layer that is arranged adjacent to the front surface side pad and an inner side of the cylindrical insulating film after removing the semiconductor substrate inside the cylindrical insulating film adjacent to the front surface side pad; and
a back surface side pad that is arranged on a back surface of the semiconductor substrate and is connected to the front surface side pad via the conductor layer.

(2) The semiconductor device according to the above (1), in which the conductor layer is arranged after the semiconductor substrate inside the cylindrical insulating film adjacent to the front surface side pad is removed by a method different from plasma etching.

(3) The semiconductor device according to the above (2), in which the conductor layer is arranged after the semiconductor substrate inside the cylindrical insulating film adjacent to the front surface side pad is removed by wet etching.

(4) The semiconductor device according to the above (2), in which the conductor layer is arranged after the semiconductor substrate inside the cylindrical insulating film adjacent to the front surface side pad is removed by chemical dry etching.

(5) The semiconductor device according to any one of the above (1) to (4), further including an insulating layer that is arranged on the front surface of the semiconductor substrate and covers the front surface side pad.

(6) A manufacturing method of a semiconductor device, including:
a semiconductor substrate removing step of removing a semiconductor substrate adjacent to a front surface side pad and an inner side of a cylindrical insulating film, the front surface side pad being formed adjacent to a front surface of the semiconductor substrate inside the cylindrical insulating film configured in a cylindrical shape penetrating the semiconductor substrate;
a conductor layer arranging step of arranging a conductor layer adjacent to an inner side of the cylindrical insulating film in which the semiconductor substrate has been removed and the front surface side pad; and
a back surface side pad arranging step of arranging a back surface side pad on a back surface of the semiconductor substrate, the back surface side pad being connected to the front surface side pad via the conductor layer.

(7) The manufacturing method of a semiconductor device according to the above (6), in which in the semiconductor substrate removing step, the semiconductor substrate inside the cylindrical insulating film adjacent to the front surface side pad is removed by a method different from plasma etching.

(8) The manufacturing method of a semiconductor device according to the above (7), in which in the semiconductor substrate removing step, the semiconductor substrate inside the cylindrical insulating film adjacent to the front surface side pad is removed by wet etching.

(9) The manufacturing method of a semiconductor device according to the above (7), in which in the semiconductor substrate removing step, the semiconductor substrate inside the cylindrical insulating film adjacent to the front surface side pad is removed by chemical dry etching.

(10) The manufacturing method of a semiconductor device according to any one of the above (6) to (9), further including an insulating layer arranging step of arranging an insulating layer on the front surface of the semiconductor substrate, the insulating layer covering the formed front surface side pad, in which in the semiconductor substrate removing step, the semiconductor substrate is removed after the insulating layer is arranged.

(11) The manufacturing method of a semiconductor device according to any one of the above (6) to (10), further including:

a cylindrical insulating film arranging step of arranging the cylindrical insulating film in the semiconductor substrate; and a front surface side pad forming step of forming the front surface side pad adjacent to the front surface of the semiconductor substrate inside the arranged cylindrical insulating film, in which in the semiconductor substrate removing step, the semiconductor substrate adjacent to the front surface side pad formed adjacent to the front surface of the semiconductor substrate inside the arranged cylindrical insulating film and the inner side of the cylindrical insulating film is removed.

(12) The manufacturing method of a semiconductor device according to any one of the above (6) to (10), further including:

a front surface side pad forming step of forming the front surface side pad adjacent to the front surface of the semiconductor substrate; and a cylindrical insulating film arranging step of arranging the cylindrical insulating film that is an insulating film configured in a cylindrical shape surrounding the formed front surface side pad and penetrating the semiconductor substrate, in which in the semiconductor substrate removing step, the semiconductor substrate adjacent to the front surface side pad formed adjacent to the front surface of the semiconductor substrate inside the arranged cylindrical insulating film and the inner side of the cylindrical insulating film is removed.

REFERENCE SIGNS LIST

1 Imaging element
10 Pixel array unit
100 Pixel
101 Photoelectric conversion unit
103 MOS transistor
121 Semiconductor substrate
131, 141 Insulating layer
132 Wiring layer
200 Through electrode
201, 208 Front surface side pad
202, 207 Conductor layer
203 Back surface side pad
204 Cylindrical insulating film
209 Through hole
1002 Imaging element

The invention claimed is:

1. A semiconductor device, comprising:
a semiconductor substrate that includes a front surface and a back surface;
a cylindrical insulating film that penetrates the semiconductor substrate;
a plurality of front surface side pads adjacent to the front surface of the semiconductor substrate;
a conductor layer adjacent to the plurality of front surface side pads, wherein
the conductor layer is on an inner side of the cylindrical insulating film, and
each front surface side pad of the plurality of front surface side pads has a specific surface in contact with the conductor layer on the inner side of the cylindrical insulating film; and
a back surface side pad on the back surface of the semiconductor substrate, wherein the back surface side pad is connected to the plurality of front surface side pads via the conductor layer.

2. The semiconductor device according to claim 1, wherein the conductor layer is arranged inside the cylindrical insulating film by removal of the semiconductor substrate, and
the removal of the semiconductor substrate is by a method different from a plasma etching method.

3. The semiconductor device according to claim 2, wherein the removal of the semiconductor substrate is by a wet etching method.

4. The semiconductor device according to claim 2, wherein the removal of the semiconductor substrate is by a chemical dry etching method.

5. The semiconductor device according to claim 1, further comprising an insulating layer on the front surface of the semiconductor substrate, wherein the insulating layer covers the plurality of front surface side pads.

6. A manufacturing method of a semiconductor device, comprising:
arranging a cylindrical insulating film in a semiconductor substrate, wherein the cylindrical insulating film penetrates the semiconductor substrate;
forming a plurality of front surface side pads adjacent to a front surface of the semiconductor substrate;
removing a portion of the semiconductor substrate that is: adjacent to the plurality of front surface side pads, and on an inner side of the cylindrical insulating film;
arranging a conductor layer on the inner side of the cylindrical insulating film after the removal of the portion of the semiconductor substrate, wherein each front surface side pad of the plurality of front surface side pads has a specific surface in contact with the conductor layer on the inner side of the cylindrical insulating film; and
arranging a back surface side pad on a back surface of the semiconductor substrate, wherein the back surface side pad is connected to the plurality of front surface side pads via the conductor layer.

7. The manufacturing method of the semiconductor device according to claim 6, further comprising removing the semiconductor substrate that is inside the cylindrical insulating film by a method different from a plasma etching method.

8. The manufacturing method of the semiconductor device according to claim 7, further comprising removing the semiconductor substrate that is inside the cylindrical insulating film by a wet etching method.

9. The manufacturing method of the semiconductor device according to claim 7, further comprising removing the semiconductor substrate that is inside the cylindrical insulating film by a chemical dry etching method.

10. The manufacturing method of the semiconductor device according to claim 6, further comprising:
   arranging an insulating layer on the front surface of the semiconductor substrate, wherein the insulating layer covers the plurality of front surface side pads; and
   removing the semiconductor substrate after the insulating layer is arranged.

11. The manufacturing method of the semiconductor device according to claim 6, further comprising
   forming the plurality of front surface side pads inside the arranged cylindrical insulating film.

* * * * *